(12) United States Patent
Border et al.

(10) Patent No.: US 7,684,101 B2
(45) Date of Patent: Mar. 23, 2010

(54) MICRO-ELECTROMECHANICAL MICROSHUTTER ARRAY

(75) Inventors: John N. Border, Walworth, NY (US); Herbert J. Erhardt, Webster, NY (US); J. Kelly Lee, Pittsford, NY (US); Marek W. Kowarz, Henrietta, NY (US); Robert M. Boysel, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 168 days.

(21) Appl. No.: 11/870,465

(22) Filed: Oct. 11, 2007

(65) Prior Publication Data

US 2009/0097095 A1   Apr. 16, 2009

(51) Int. Cl.
*G02B 26/00* (2006.01)
(52) U.S. Cl. .................. 359/224.1; 359/290; 359/292
(58) Field of Classification Search .............. 359/204.3, 359/223.1, 224.1, 224.2, 246, 247, 290, 291, 359/292
See application file for complete search history.

(56) References Cited

U.S. PATENT DOCUMENTS

| | | | | |
|---|---|---|---|---|
| 5,078,479 A | * | 1/1992 | Vuilleumier | 359/290 |
| 5,587,832 A | * | 12/1996 | Krause | 359/385 |
| 5,784,190 A | | 7/1998 | Worley | |

FOREIGN PATENT DOCUMENTS

EP   1 026 034   8/2000

OTHER PUBLICATIONS

K. Motohara, et al., "Development of Microshutter Arrays for Ground-Based Instruments", Proc. Of Instrumentation of Extremely large Telescopes, 2005, XP002510031, figures 1, 2, 5, 6.

T. Takahashi, et al., "Electrostatically Addressable Gatefold Micro-Shutter Arrays for Astronomical Infrared Spectrograph", Asia-Pacific Conference of Transducers and Micro-Nano Technology—APCOT 2006, figures 1, 2, 5, 6b.

"Microshutter Array Development for the James Webb Space Telescope" by Li et al. In Proceedings of SPIE, Micro- and Nanotechnology: Materials, Processes, Packaging, and Systems II, vol. 5650, pp. 9-16.

"Development of Microshutter Arrays for Ground-Based Instruments" by Motohara et al., presented at the Workshop for Instrumentation on Extremely Large Telescopes, Ringberg, Germany, Jul. 2005.

* cited by examiner

*Primary Examiner*—Joseph Martinez
(74) *Attorney, Agent, or Firm*—Thomas J. Strouse; Nancy R. Simon

(57) ABSTRACT

A microshutter array has a frame having a light transmissive portion. Linear microshutter elements extend across the light transmissive portion and in parallel to each other. Each microshutter element has a flat blade extended in a length direction and first and second torsion arms extending outwards from each side of the blade in the length direction, the blade extending across the light transmissive portion. There is at least one electrode associated with each linear microshutter element and extended in the length direction parallel to the microshutter element.

28 Claims, 23 Drawing Sheets

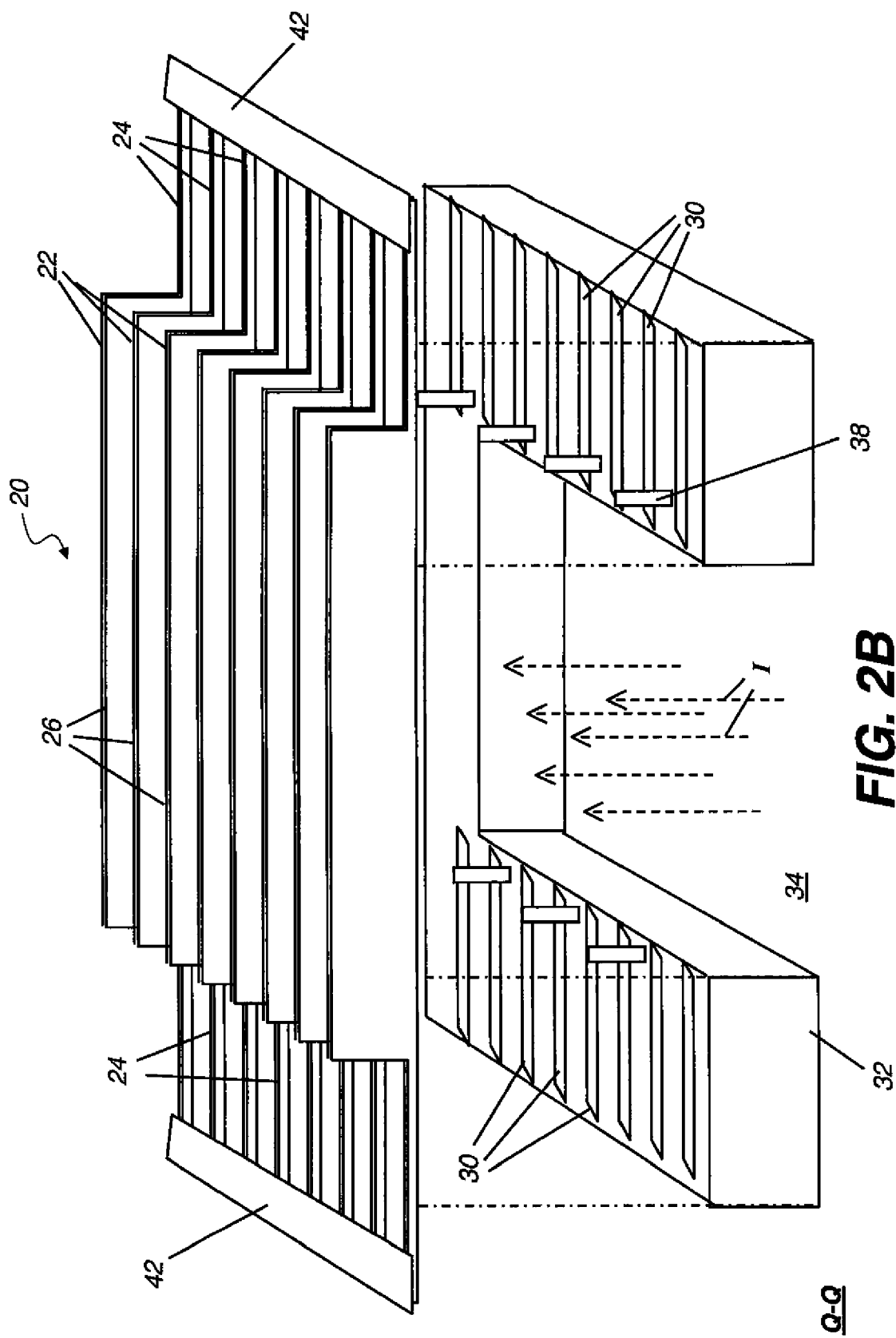

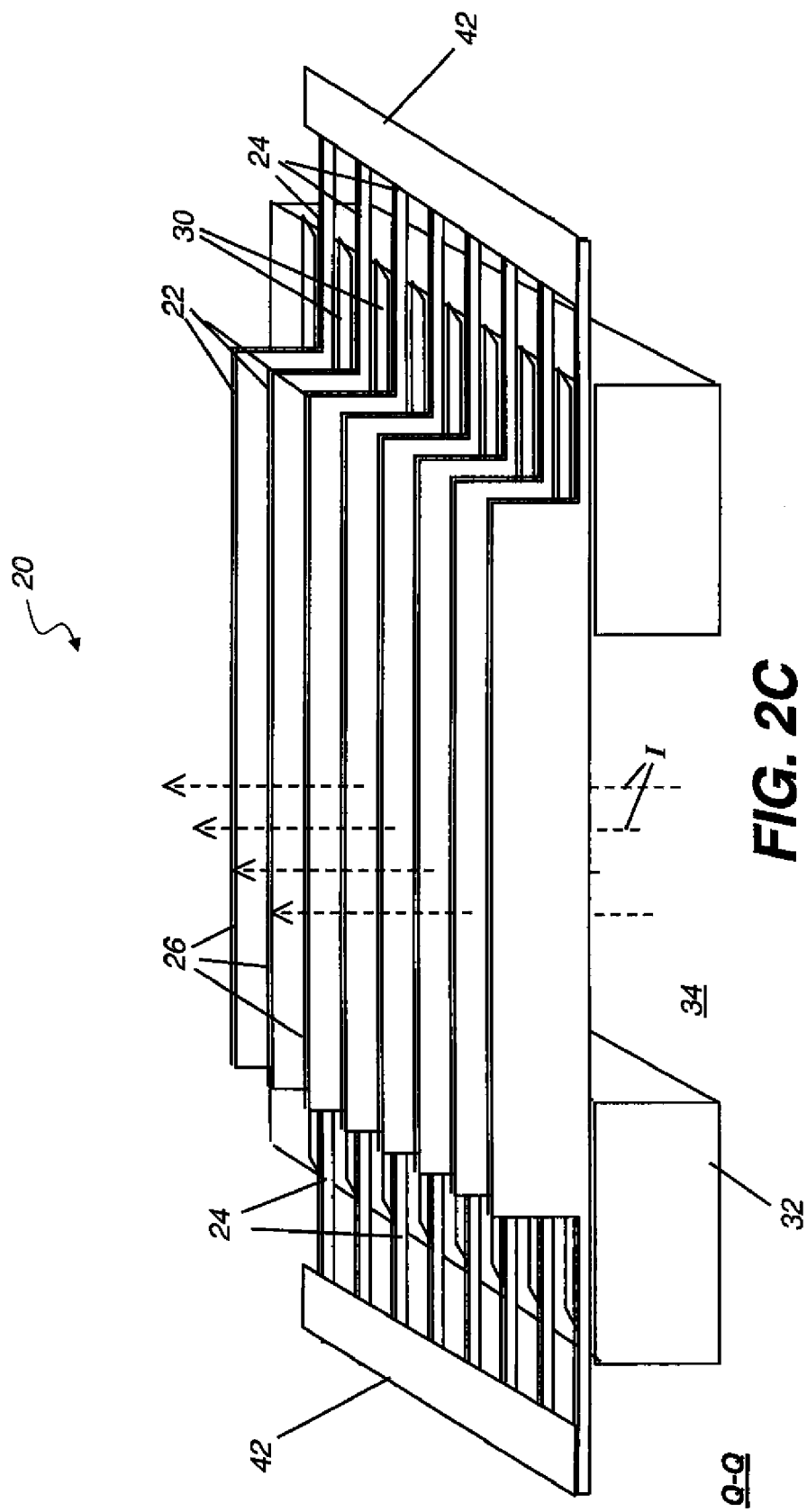

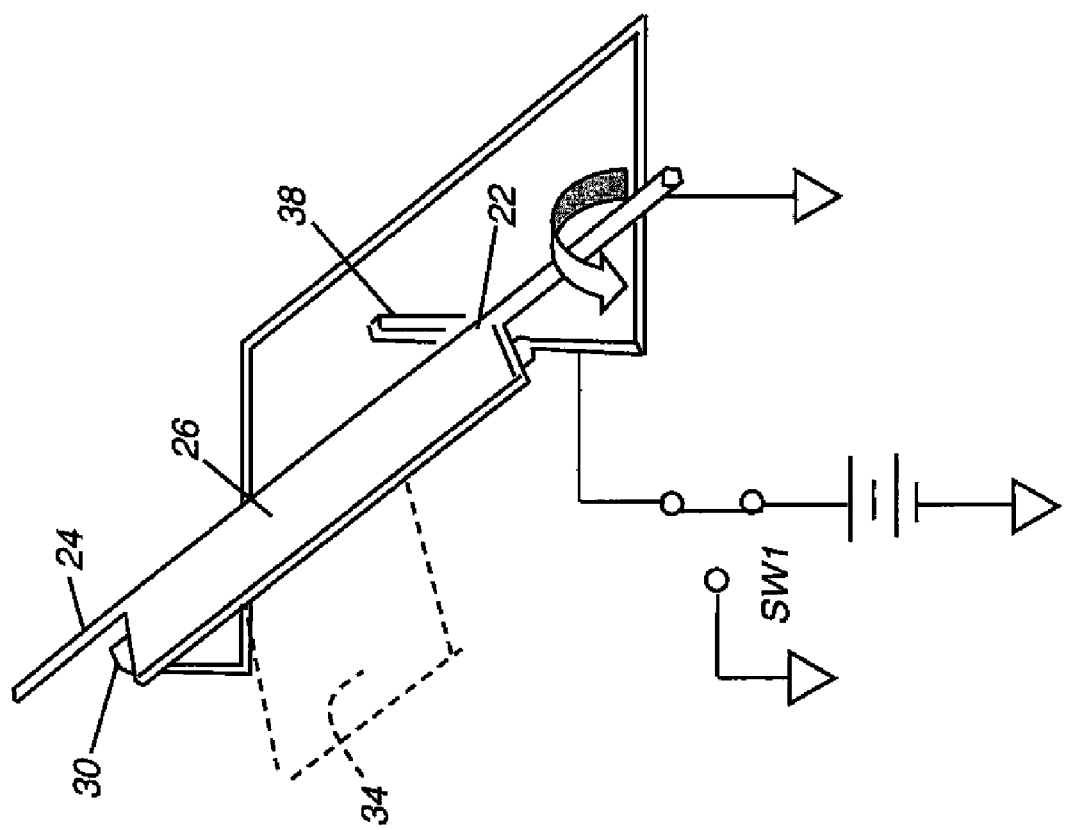

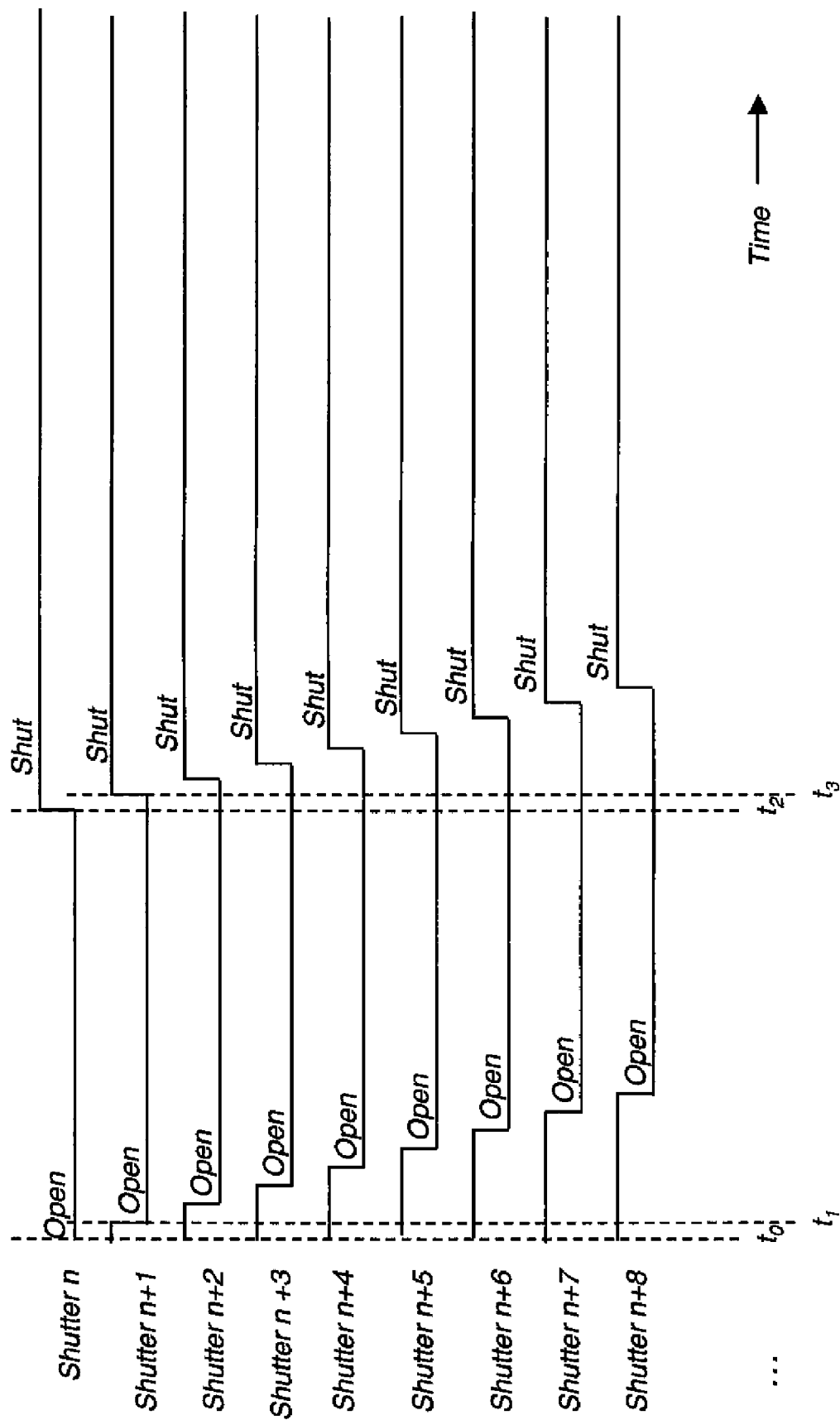

MICRO-ELECTROMECHANICAL MICROSHUTTER ARRAY

FIELD OF THE INVENTION

This invention generally relates to shutter devices and more particularly relates to a micro-electromechanical array of individually actuable light shutters for selectively blocking light over one or more rows of light-sensing pixels.

BACKGROUND OF THE INVENTION

In digital camera and other imaging applications it is often useful to be able to selectively block light from falling on some portions of an electronic sensor and allow light to fall on other portions of the sensor. Conventional mechanical shuttering techniques have been used for an exposure sequence that sweeps across the sensor exposing only a portion at a time; however, this type of solution can be less desirable for miniaturized sensor arrays due to constraints of size, mechanical complexity, reliability, and cost.

MicroElectroMechanical Systems (MEMS) technology has been employed for providing shutter arrays with selectively actuable shutters in a number of display applications. For example, MEMS shutter arrays for display devices are described in U.S. Pat. No. 5,078,479 entitled "Light Modulation Device with Matrix Addressing" issued to Vuilleumier and U.S. Pat. No. 5,784,190 entitled "Electro-Micro-Mechanical Shutters on Transparent Substrates" issued to Worley. With display devices of this type, MEMS shutters correspond to image pixels, so that each display pixel is formed using one or more shutter elements.

MEMS shutter arrays have also been adopted for use in light sensor applications. In one highly publicized NASA program, a MEMS microshutter array has been under development to support field selection for the near infrared spectrograph on the James Webb Space Telescope (JWST). This array uses a 128×64 element matrix of individually actuable 100 micron×200 micron shutter blades for variable field selection. Each shutter blocks light to a separate cell, with an electrode along one of the cell walls. Each shutter is normally closed until actuated. The shutter blades themselves are electromagnetically opened by sweeping a magnet over the array, then electrostatically latched over the desired target positions. This device is described in a paper entitled "Microshutter Array Development for the James Webb Space Telescope" by Li et al. in *Proceedings of SPIE, Micro- and Nanotechnology: Materials, Processes, Packaging, and Systems II*, volume 5650, pp. 9-16.

Recognizing inherent limitations of the solution used for the JWST device, astronomy researchers working with the Japan Aerospace Exploration Agency have proposed an alternate microshutter array that is electrostatically actuated. Their work is described in a paper entitled "Development of Microshutter Arrays for Ground-Based Instruments" by Motohara et al. presented at the Workshop for Instrumentation on Extremely Large Telescopes, Ringberg, Germany, July, 2005. The Motohara et al. device similarly uses an array of cells with a single shutter for each cell, normally closed until actuated and with its actuating electrode along a cell wall.

While MEMS microshutters have been developed for various display devices and for astronomical instrumentation, however, the solutions that have been proposed for either the JWST or Motohara et al. devices would be difficult to scale to the dimensions required for digital camera applications or for hand-held image capture devices in general. Moreover, even if such devices could be scaled to the dimensions needed for digital camera applications, problems such as poor fill factor, inherent fabrication difficulties, and disappointing shutter response times would significantly compromise their usefulness. These devices require considerable surface area for actuation and mechanical support components, severely reducing the proportion of the array that is available for transmission of light. This problem is particularly troublesome for small digital image capture apparatus, where it is important to provide as much light as possible from the object field.

Operational requirements further compound the problem. For example, the electromechanical initialization used in the JWST device, sweeping a magnet over the microshutter array in order to initially latch shutters in closed position, is impractical for implementation in a digital camera or other digital imaging apparatus. The high latching voltages required by the Motohara et al. device, in excess of 100 Vdc, render this type of solution wholly unsuitable for use within digital cameras. Both the JWST and Motohara et al. devices use electrodes that lie along a cell wall, which would not be an arrangement that could be readily fabricated at a smaller size using known MEMS techniques.

Thus, although MEMS microshutter arrays have been developed for some types of display and image-sensing applications, e.g., large separate cell arrays, there remains a need for a microshutter array solution that is suitable for use with digital cameras and other hand-held imaging devices.

SUMMARY OF THE INVENTION

In general terms, the present disclosure relates to shutter devices and more particularly relates to a micro-electromechanical array of individually actuable light shutters for selectively blocking light over one or more rows of light-sensing pixels.

One aspect of the present invention is a microshutter array. The microshutter array includes a frame having a light transmissive portion, a plurality of linear microshutter elements extending across the light transmissive portion and in parallel to each other, each microshutter element comprises a flat blade extended in a length direction across the light transmissive portion and first and second torsion arms extending outwards from each side of the blade in the length direction, and at least one electrode associated with each linear microshutter element and extended in the length direction parallel to the microshutter element.

Another aspect of the present invention is a method for forming an image of a scene. The method includes providing an image-forming lens for directing light to a sensor having an array of pixel elements arranged in rows, disposing a microshutter array between the image-forming lens and the sensor, and actuating one or more microshutter elements in the microshutter array for exposing associated rows of pixel elements to the light.

Another aspect of the present invention is a method for producing a multiple exposed image. The method includes, providing an image-forming lens for directing light to a sensor having an array of pixel elements arranged in rows, disposing a microshutter array between the image-forming lens and the sensor, and actuating one or more microshutter elements in the microshutter array to generate multiple opening and closing of the aperture to produce a multiple exposure image.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 2B is an exploded view showing a number of key components of the microshutter array, spatially separated for better visibility;

FIG. 2C is the re-assembled view for the components shown in FIG. 2B;

FIGS. 6A, 6B, and 6C are schematic views showing stages in actuation of a single shutter element;

FIG. 14 shows a timing diagram of an actuation sequence for successive exposure and shielding of a set of shutter elements in the array.

DETAILED DESCRIPTION OF THE INVENTION

Figure 1:
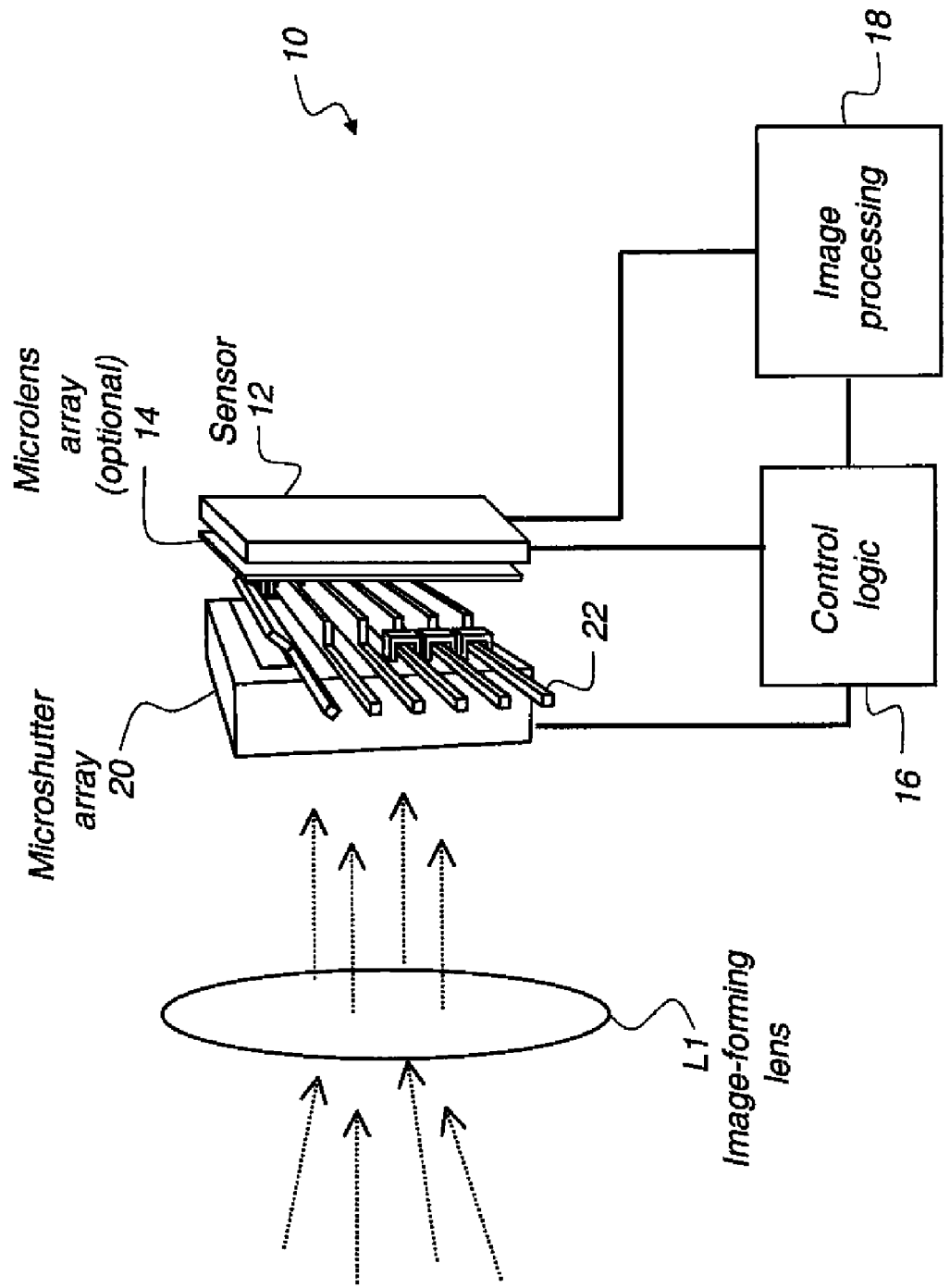
FIG. 1 is a schematic block diagram showing major components of an imaging apparatus using a microshutter array.

The present description is directed in particular to elements forming part of, or cooperating more directly with, apparatus in accordance with the invention. It is to be understood that elements not specifically shown or described may take various forms well known to those skilled in the art. Referring now to the drawings in which like reference numbers represent corresponding parts throughout:

Figures shown and described herein are provided to illustrate principles of operation and fabrication according to the present invention and are not drawn with intent to show actual size or scale. Because of the relative dimensions of the component parts for the microshutter array of the present invention, some exaggeration is necessary in order to emphasize basic structure, shape, and principles of operation.

The schematic diagram of FIG. 1 shows an imaging apparatus 10 using a one-dimensional microshutter array 20 according to the present invention. An imaging sensor 12, such as a CCD or CMOS imaging sensor, has an array of pixels arranged in rows and columns. Incident light from the object field, indicated by dotted-line arrows, is directed by an image-forming lens L1 to sensor 12 through a microshutter array 20 and, optionally, through a microlens array 14. Microshutter array 20 has a number of individually actuable shutter elements 22, also termed microshutter elements, as described in detail subsequently. Only a small number of shutter elements 22 are shown in the diagram of FIG. 1, with deliberately exaggerated scale for MEMS embodiments in this and following drawings. Actuation of shutter elements 22 is controlled by a control logic processor 16 that also controls image sensing functions in sensor 12. An image processing component 18 cooperates with control logic processor 16 to obtain, process, and store the image data obtained from sensor 12.

Unlike conventional shutter configurations, microshutter array 20 uses shutter elements 22 that span one or more lines or rows of pixels on sensor 12. In the embodiment shown in FIG. 1, each shutter element 22 extends fully across the width of the active area of sensor 12, providing a shutter for one or more complete rows of pixels. Having individually actuable shutter elements 22, this design is advantaged over conventional MEMS microshutter array configurations because it allows exposure or shielding of one or more complete rows of pixels at a time. This arrangement also increases the effective fill factor over that available using conventional MEMS shutter solutions, since there are no obstructing walls or other light-blocking structures on the periphery of pixels that are within the sensor array.

Figure 2A:
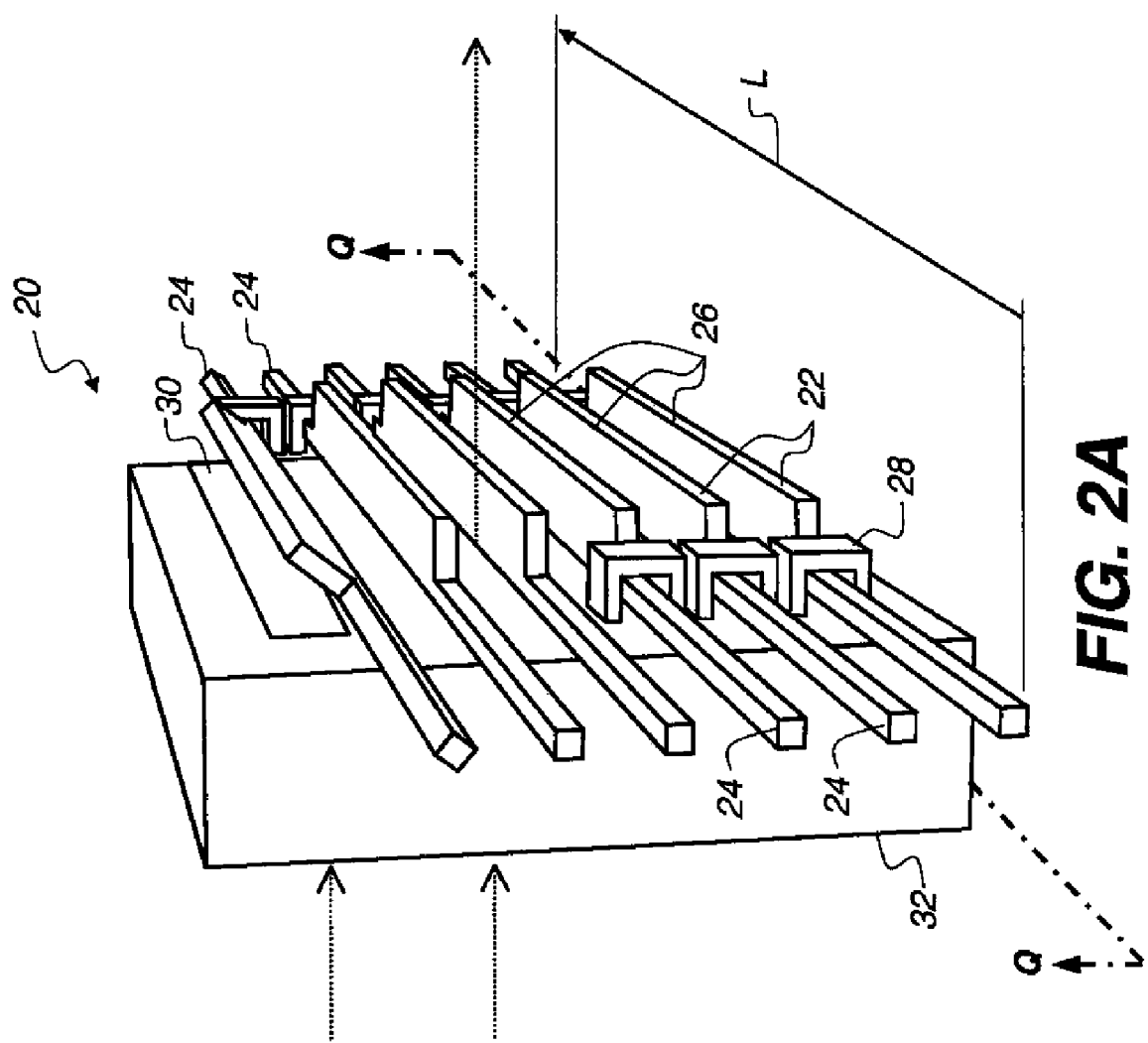
FIG. 2A is a perspective view of a microshutter array in an embodiment of the present invention.

The perspective view of FIG. 2A shows a section of microshutter array 20 in more detail, with components again exaggerated in size and with only a few shutter elements 22 shown. Each shutter element 22 has a flat blade 26 and two torsion arms 24 extending outwards from each side of blade 26 along length L, the extended length of shutter element 22. Each shutter element 22 may seat within an optional journal bearing 28, a few of which are removed from FIG. 2 for better visibility of shutter element 22. The purpose of journal bearing 28 is to help with microshutter alignment and to prevent collisions or other undesirable interactions between adjacent shutter elements 22.

The partially exploded view of FIG. 2B and corresponding re-assembled view of FIG. 2C are a bottom view of the section shown in FIG. 2A, showing some of the key components of microshutter array 20. Incident light direction is shown by arrows labeled I. Each shutter element 22 has at least one corresponding electrode 30 that provides electrostatic actuation, as described in more detail subsequently. Unlike conventional microshutter configurations, electrode 30 lies in a plane that is orthogonal to the direction of incident light I. A frame 32 supports the set of shutter elements 22 and their corresponding journal bearings 28 and electrodes 30, along with other support elements, and provides an opening 34 or, more generally, a light transmissive portion, transparent to incident light I.

The exploded view presentation of FIGS. 2B and 2C is a visualization intended to help illustrate the overall relationship of parts and their function. However, these figures could be interpreted incorrectly without a more complete understanding of how microshutter array 20 is fabricated. In one embodiment, fabrication is performed using MEMS techniques that selectively deposit and pattern various materials onto a substrate. Frame 32 is formed from the substrate material, such as silicon or quartz. Electrical and mechanical elements that form, interconnect, and actuate microshutter array 20 are also formed on the substrate material by successive MEMS deposition and patterning stages. One exemplary fabrication process is outlined later in this disclosure.

Anchors 42 are provided on each end of torsion arms 24. Posts 38 or some other device prevent unwanted twisting of shutter elements 22, as described in more detail subsequently.

Figure 3A:
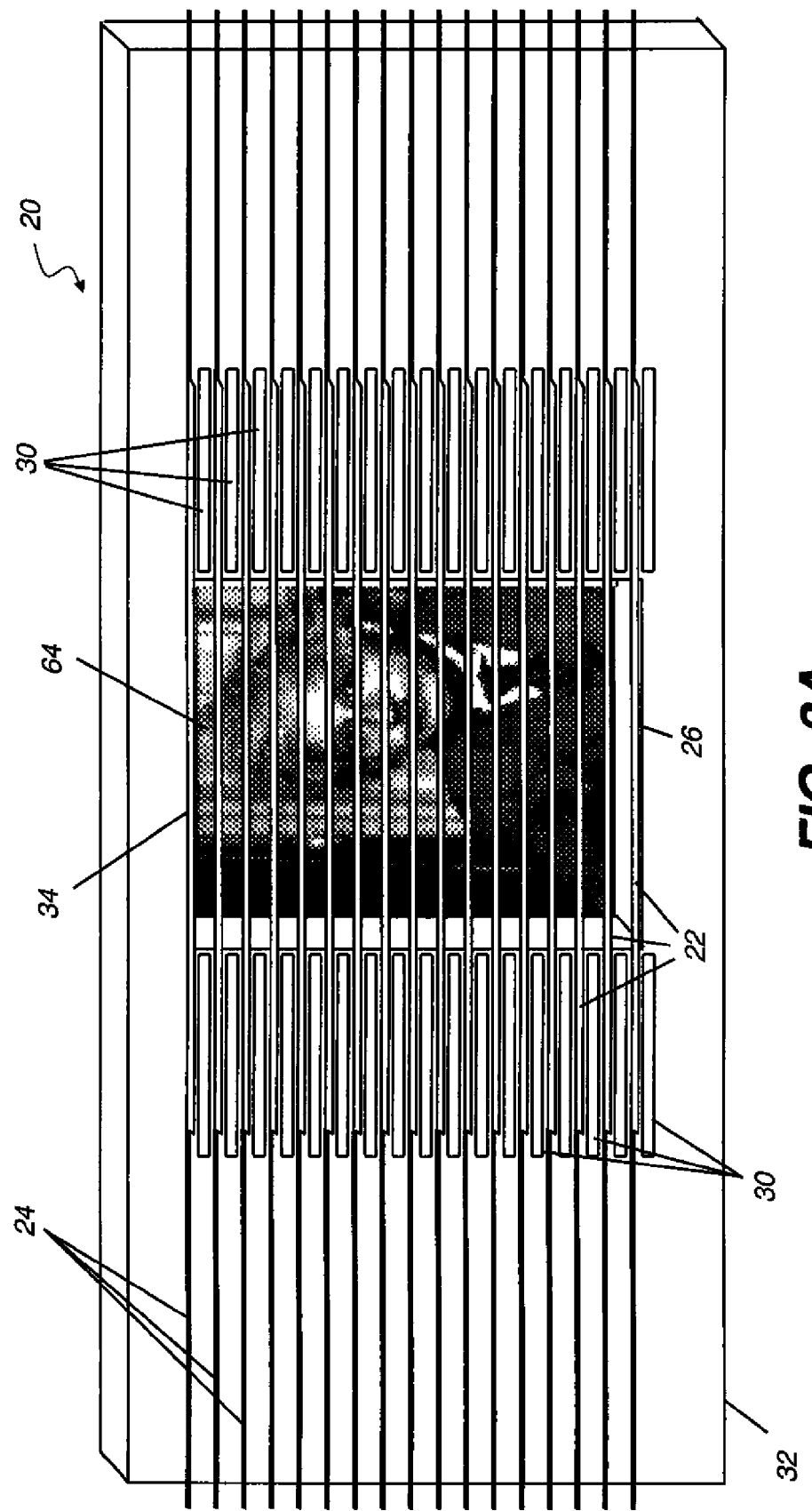
FIG. 3A is a sensor-side plan view of the microshutter array of the present invention with all shutter elements open.
Figure 3B:
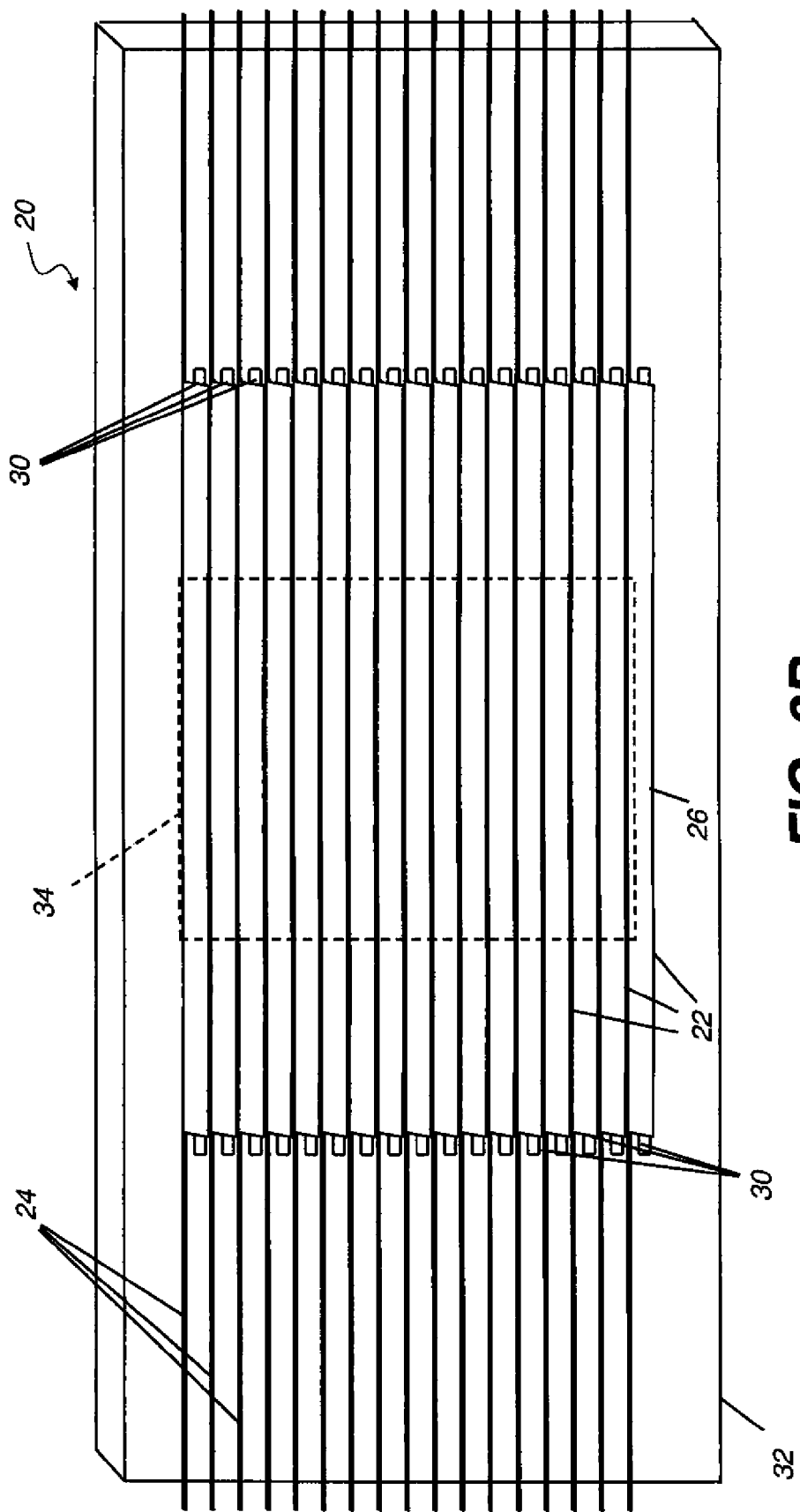
FIG. 3B is a sensor-side view of the microshutter array of the present invention with all shutter elements closed (actuated)
Figure 3C:
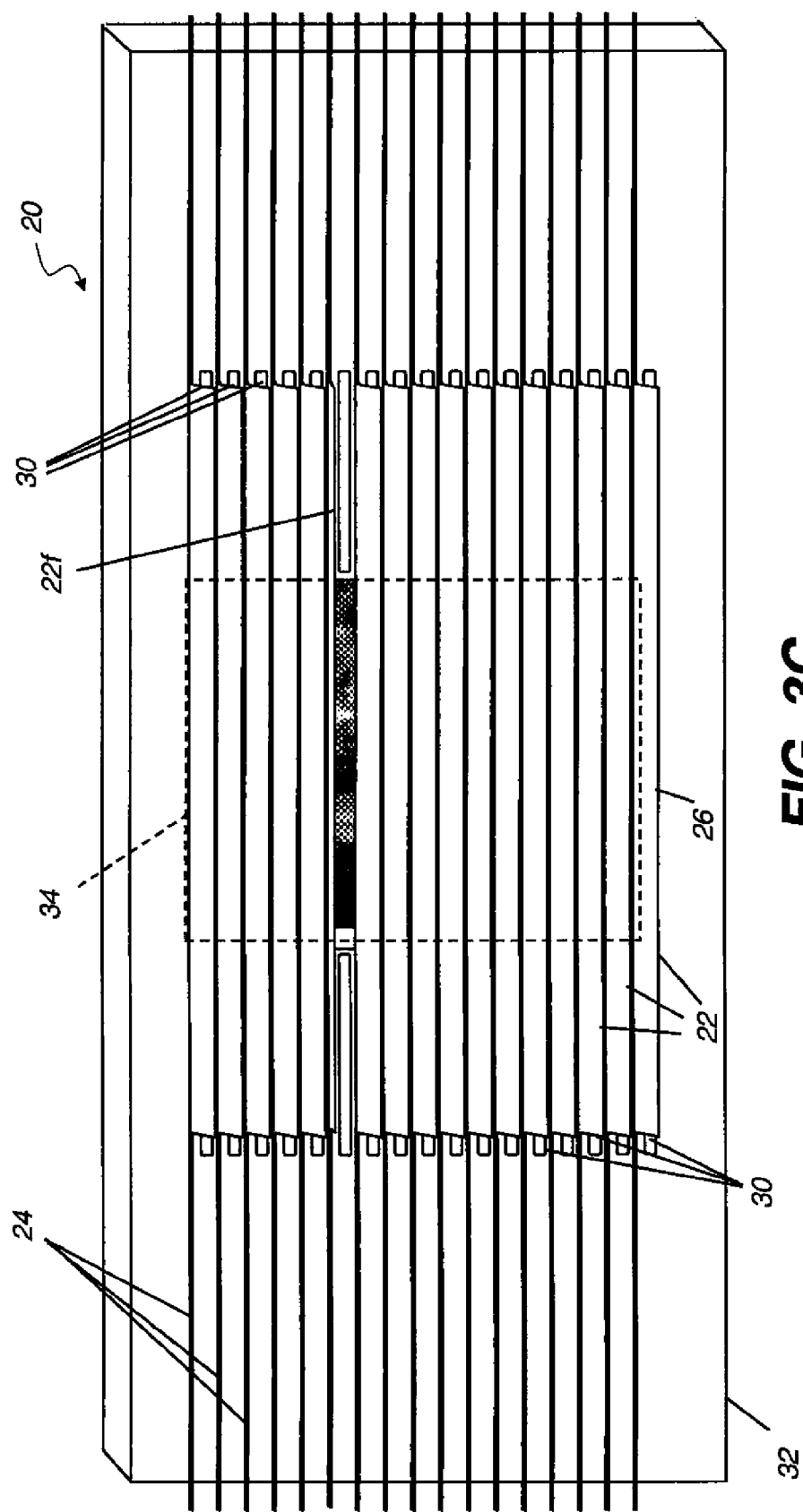
FIG. 3C is a sensor-side view of the microshutter array of the present invention with one shutter element open (unactuated)

FIGS. 3A, 3B, and 3C are plan views of microshutter array 20 taken from the side of sensor 12 (FIG. 1). FIG. 3A shows all shutter elements 22 in the un-actuated state, so that light from the object field is transmitted through opening 34. For a digital camera application, for example, a subject 64 in the object field could be visible to the sensor. FIG. 3B shows all shutter elements 22 in the actuated state. Voltage potential applied between shutter elements 22 and electrodes 30 causes blades 26 of shutter elements 22 to rotate to a position parallel to the surface of frame 32, blocking the light to sensor 12 through opening 34, shown in a dotted outline in this figure.

FIG. 3C shows an advantage of microshutter array 20 having individually actuable microshutter elements 22. Here, a single microshutter element 22f is actuated, allowing blocking of one or more rows of pixels of the sensor.

Figure 4A:
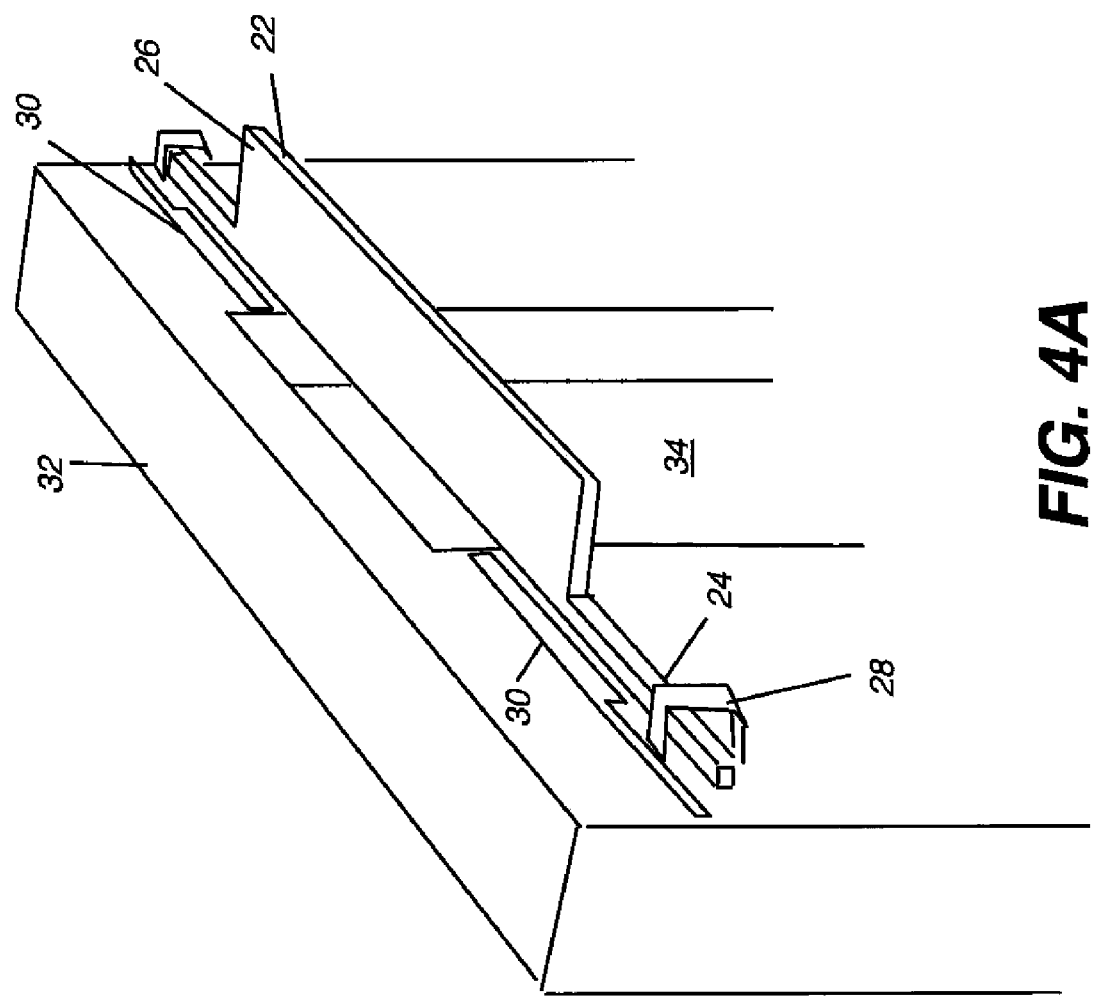
FIG. 4A is a perspective view showing a single shutter element and its support electrodes in an embodiment using a hollow frame.

FIG. 4A shows frame 32 with only a single shutter element 22 and its corresponding electrodes 30. In this embodiment, transparent opening 34 within frame 32 is shown with electrodes 30 on each side of opening 34. This arrangement increases the amount of surface area of electrodes 30 that will electrostatically attract blade 26 and, for this reason, is generally advantaged over configurations that have only a single electrode 30 along one side of frame 32. With shutter element 22 in its open position, as shown, light is transmitted through microshutter array 20.

Figure 4B:
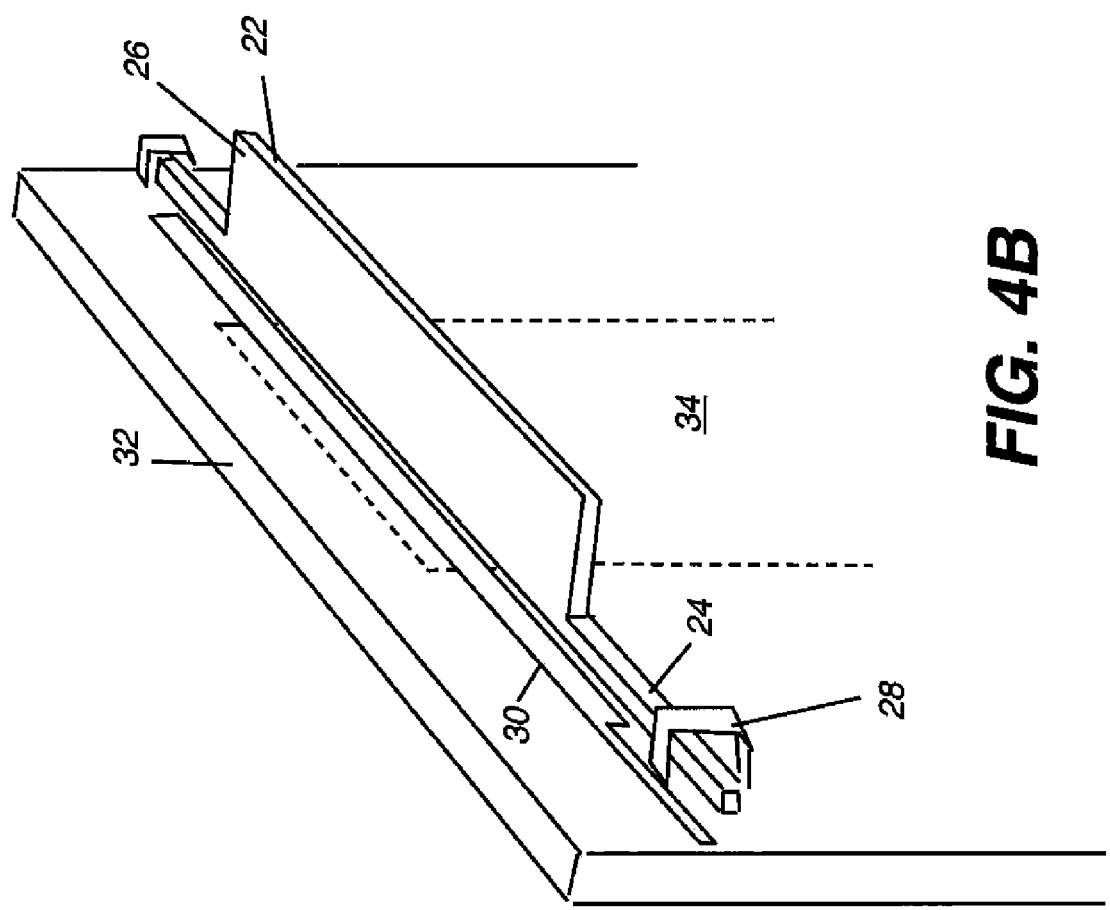
FIG. 4B is a perspective view showing a single shutter element and its support electrodes in an embodiment using a frame with a transparent window.

As shown in FIG. 4B, opening 34 may alternately be a transparent window within the substrate of frame 32. Here, the substrate may be quartz or some other transparent material. Where a transparent substrate is used, a single transparent electrode 30 can extend across some portion of opening 34 without blocking the light. Transparent electrode 30 could be a conductive material such as Indium-Tin Oxide (ITO), for example.

Figure 5A:
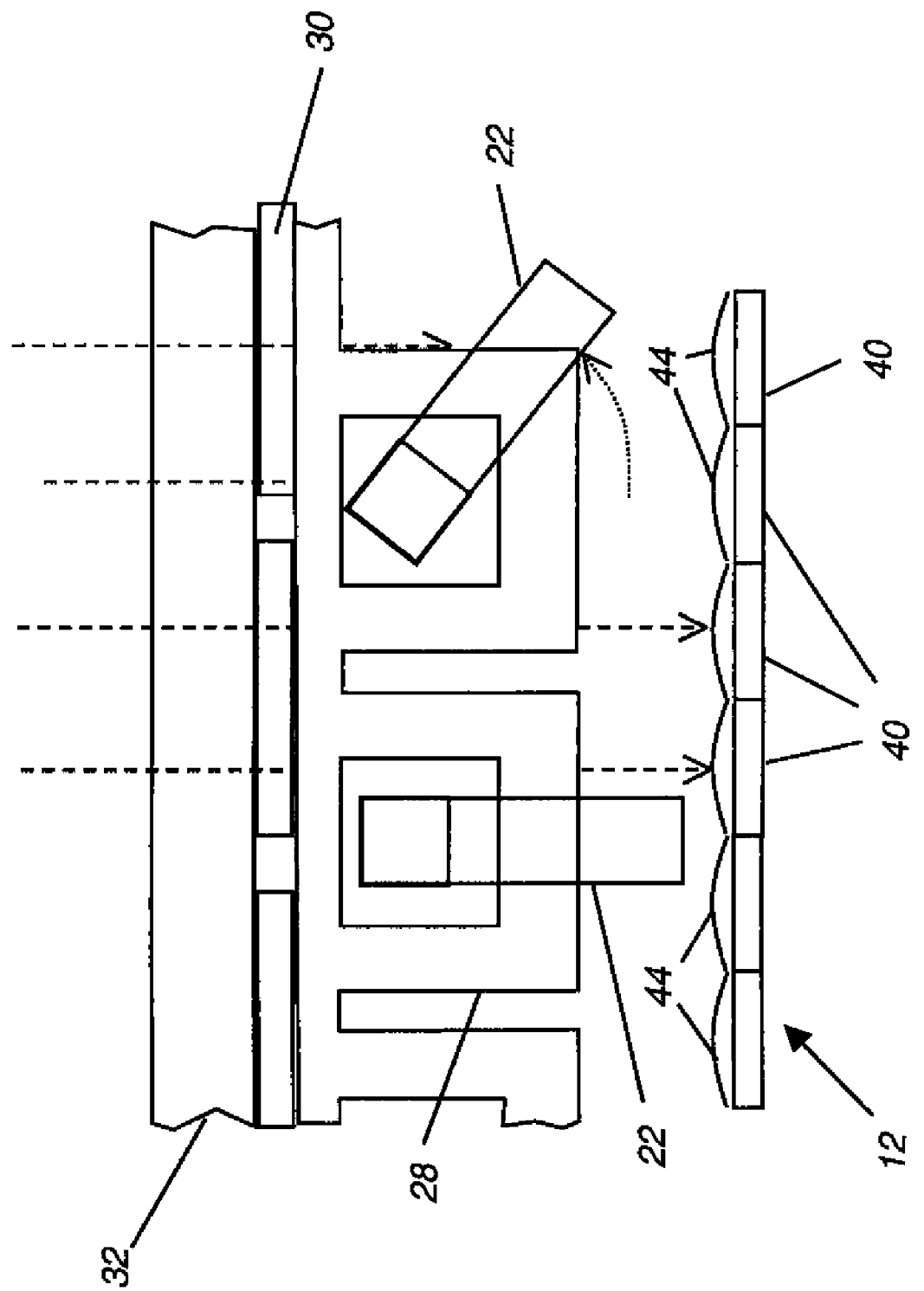
FIG. 5A is a side view showing two shutter elements in open and partially closed positions.

Shutter elements 22 are normally in the open position, allowing light transmission to sensor pixels, and closing to block light when actuated. However, the invention is not limited to the shutter element 22 being in the normally open position, and any suitable position for the shutter can be a normal state; e.g., normally closed. The side view of FIG. 5A shows two shutter elements 22, one in open and the other moving into a closed position when actuated, blocking light to corresponding rows of pixel elements 40 on sensor 12. Each shutter element 22 passes or blocks light to two rows of pixel elements 40 in this embodiment. Other arrangements are possible, such as blocking more than two rows of pixel elements 40 or blocking only a single row, for example. In the embodiment shown, an optional lenslet 44 is provided for each pixel element 40. For some types of sensors 12, each pixel element has a corresponding lenslet 44 that may be formed in the surface of sensor 12. Optionally, lenslet 44 can be provided using a separate film, such as microlens array 14 shown in FIG. 1.

Figure 5B:
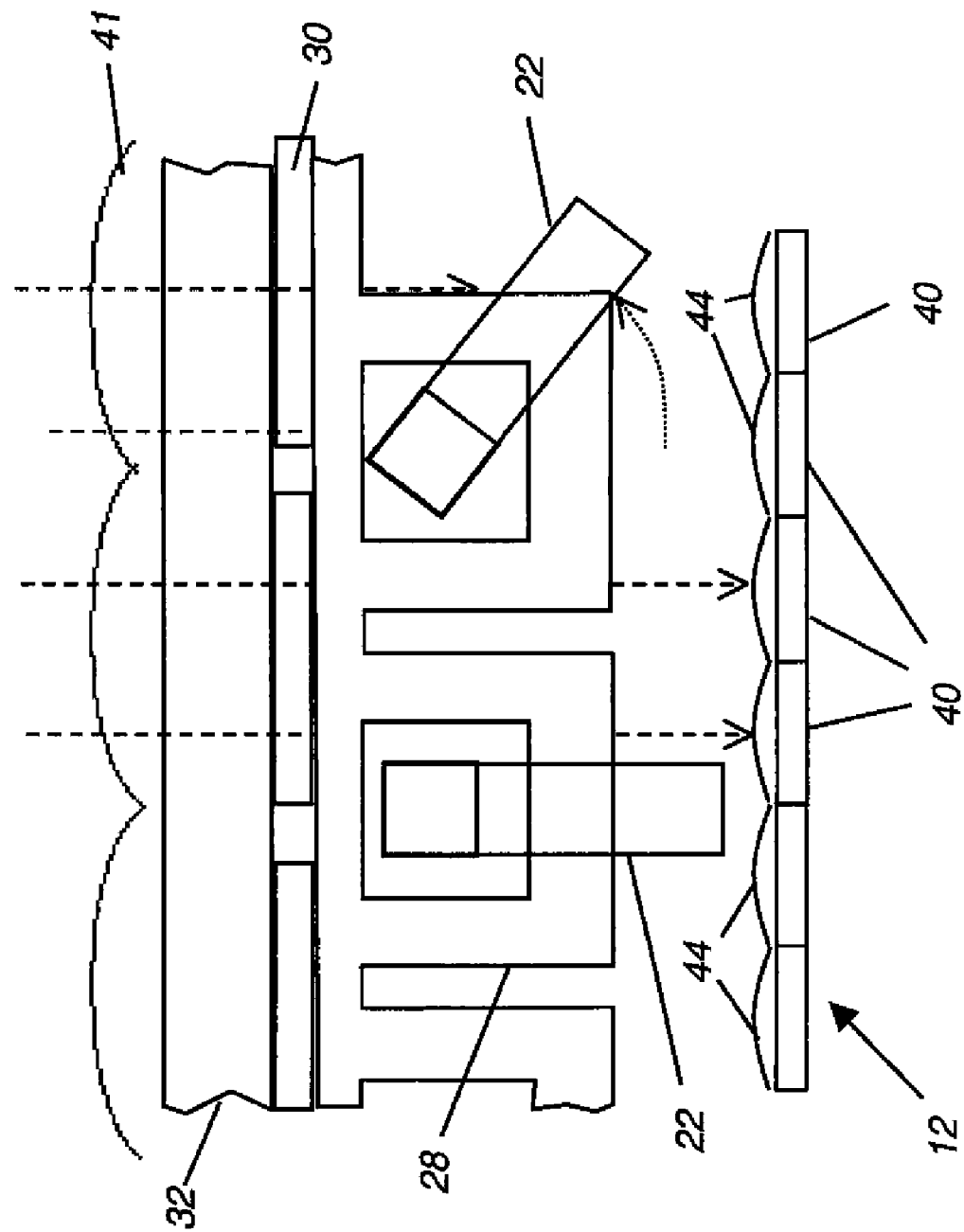
FIG. 5B is a side view showing two shutter elements in open and partially closed positions with lenslets to direct the light between the microshutter elements.

FIG. 5B shows another embodiment using lenslets. As shown in this figure, lenslets 41 can be positioned above each of shutter elements 22 to direct the light through the spaces between shutter elements 22 to reduce losses due to light blocking when shutter elements 22 are in the open state. Lenslets 41 can be located on the top of frame 32 or at any other location where the light can be directed prior to being blocked by the shutter elements of other portions of the apparatus. Lenslets 41 for directing the light between shutter elements 22 can be provided in addition to lenslets 44 or can be used without lenslets 44. Lenslets 41 can be linear lenses that extend across the opening 34 or they can extend only a portion of the way across the opening.

Figure 6B:
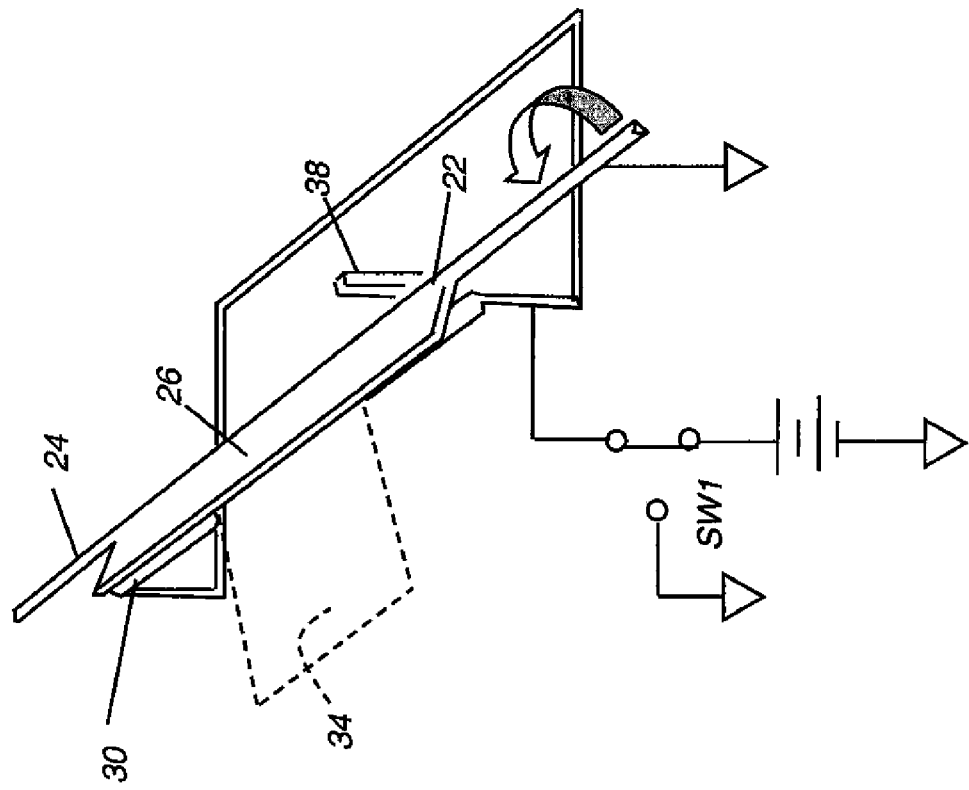
Figure 6A:
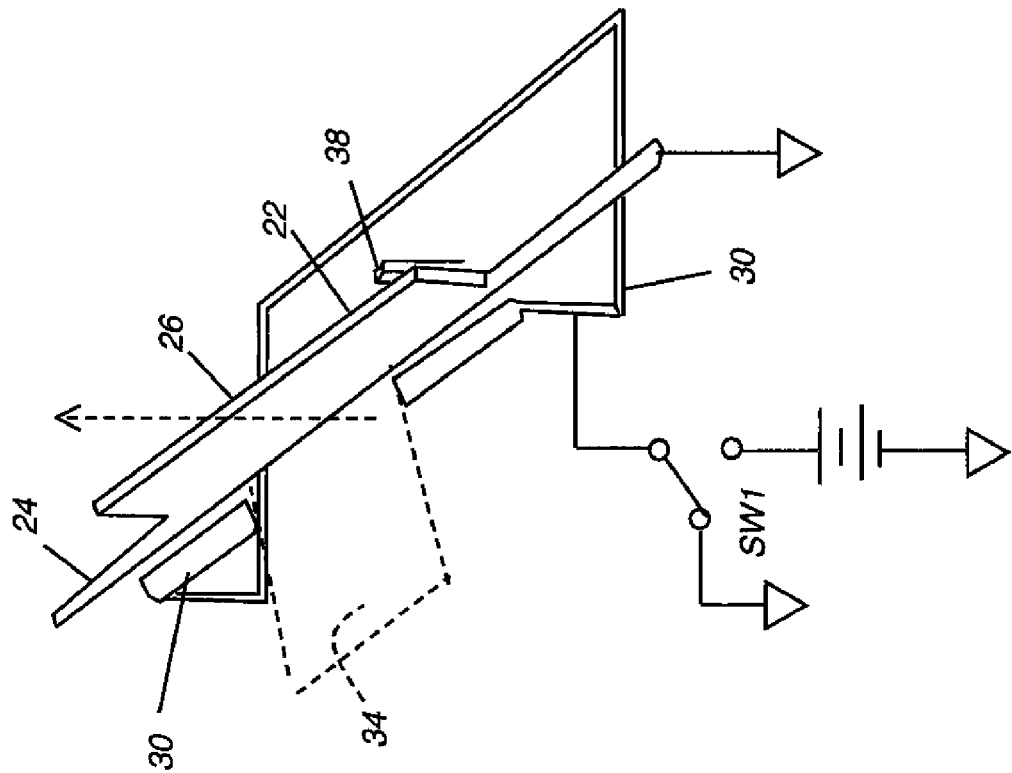

Schematic views of FIGS. 6A, 6B, and 6C show a single shutter element 22 in its normal un-actuated state, its partially actuated state during transition, and its actuated state, respectively. Shutter element 22 is designed to transmit light when not actuated, as shown in FIG. 6A. When voltage is applied, as represented schematically by position of a switch SW1, electrostatic attraction that is provided between electrodes 30 and portions of the blade 26 of shutter element 22 causes the blade 26 of shutter element 22 to rotate toward electrodes 30 as shown, providing shutter action and blocking light transmission accordingly. The rotation of blade 26 produces a twisting action in torsion arms 24 causing a torque energy to be stored in torsion arms 24 because the ends of the torsion arms 24 are fixed (at anchors 42, shown in FIGS. 2B and 2C). As a result, when the voltage potential is removed from electrodes 30, the torque stored in torsion bars 24 causes blades 26 to rotate back to the un-actuated state of FIG. 6A. FIGS. 6A, 6B, and 6C show the configuration in which opening 34 is hollow, with electrodes 30 extending along the surface of frame 32 on each side of opening 34 as was described with reference to FIGS. 2 and 3A. The same type of rotation caused by electrostatic attraction would occur for transparent embodiments such as that shown in FIG. 4B.

Because shutter elements 22 are tightly packed together along frame 32, it may be necessary to provide some mechanical blocking to prevent unwanted turning of blade 26 in the wrong direction or beyond the desired open position. Post 38 or some other mechanical stop, as shown in FIGS. 2B and 6A-6C, can be provided to prevent movement of blade 26 except in the intended direction.

The design of shutter element 22 and its corresponding electrodes 30 makes it possible to effect actuation at a comparatively low voltage. Unlike earlier microshutter designs, the actuation voltage that is applied to electrodes 30 is typically in the range from about 20 to about 30 Vdc. This is significantly improved over conventional electrostatic microshutter arrays that can require 100 Vdc or more for actuation. Also, unlike the JWST device also cited earlier, the microshutter array of the present invention does not require initialization using an electromagnet. The design of microshutter array 20 of the present invention is also advantaged for speed, with actuation times at less than 10 or 20 microseconds, varying with actuation voltage level.

In general, each shutter element 22 is at ground or at some other reference voltage that is different from the voltage applied to the electrodes 30, thus generating an electrostatic force to cause the blade of shutter element 22 to rotate in a closed position, as shown in FIGS. 6A-6C.

Fabrication

Figure 7A:
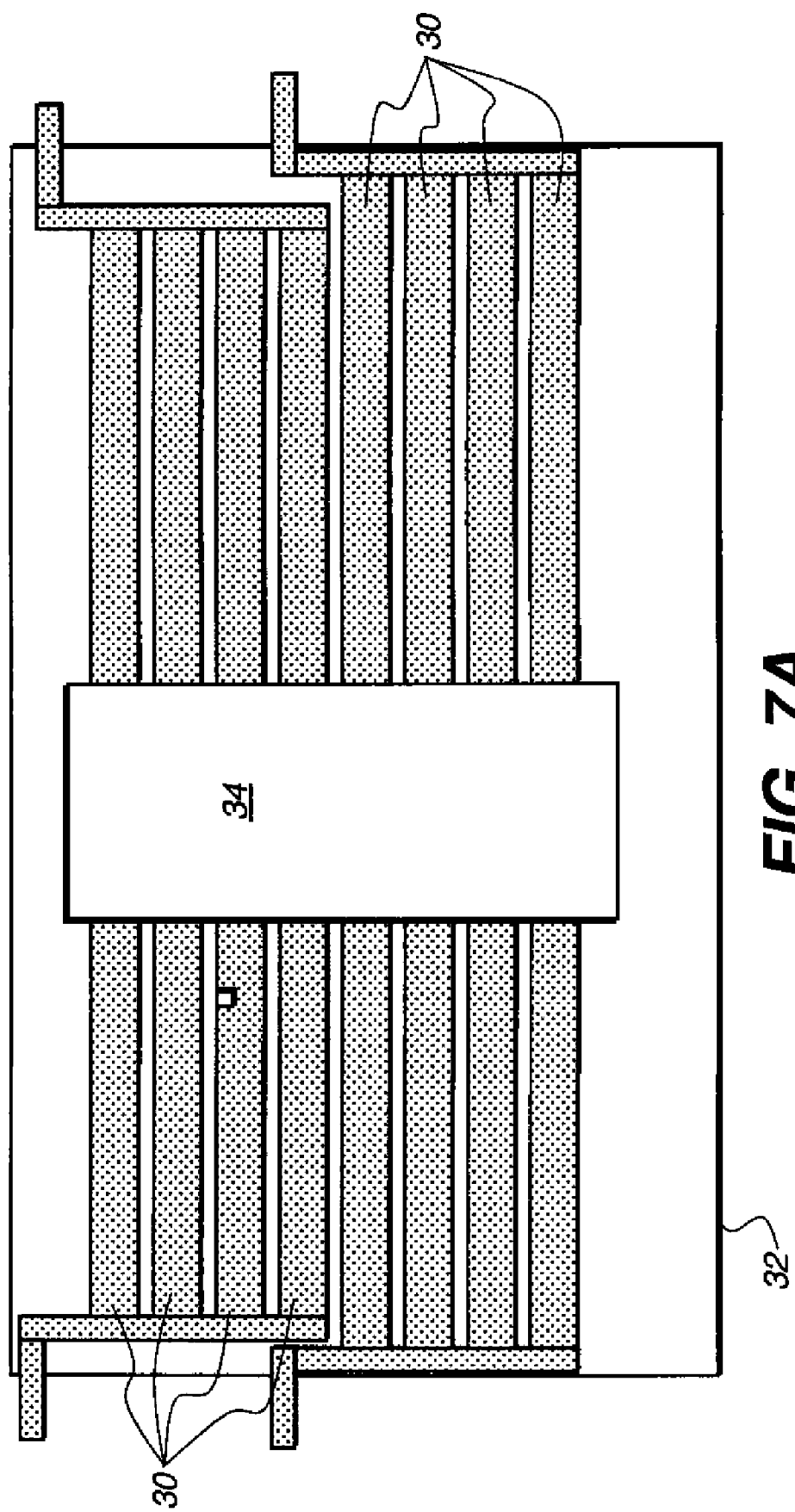
FIGS. 7A, 7B, and 7C are plan views showing different functional layers, separately and assembled, that form the microshutter array in one embodiment.
Figure 7B:
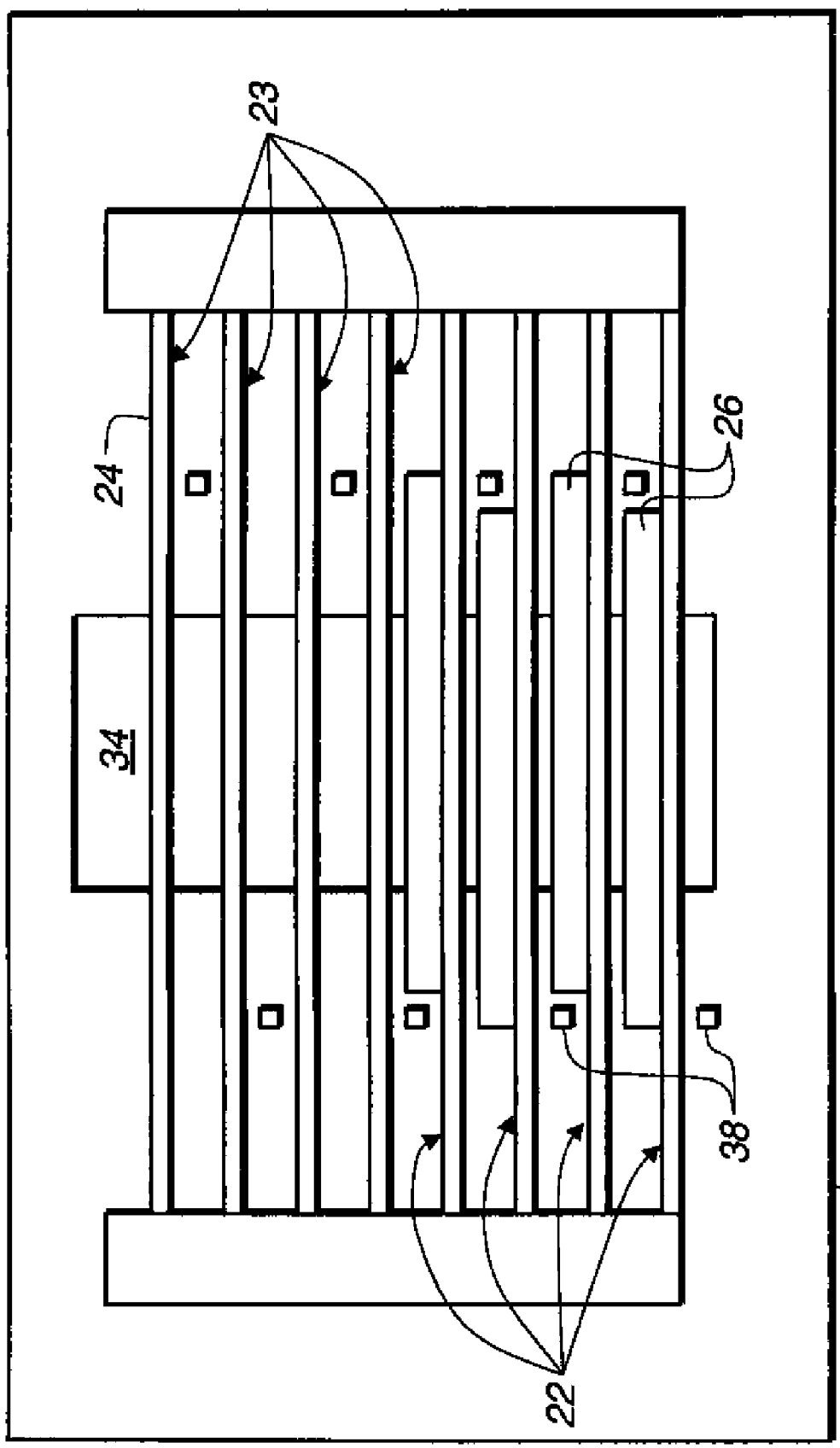
Figure 7C:
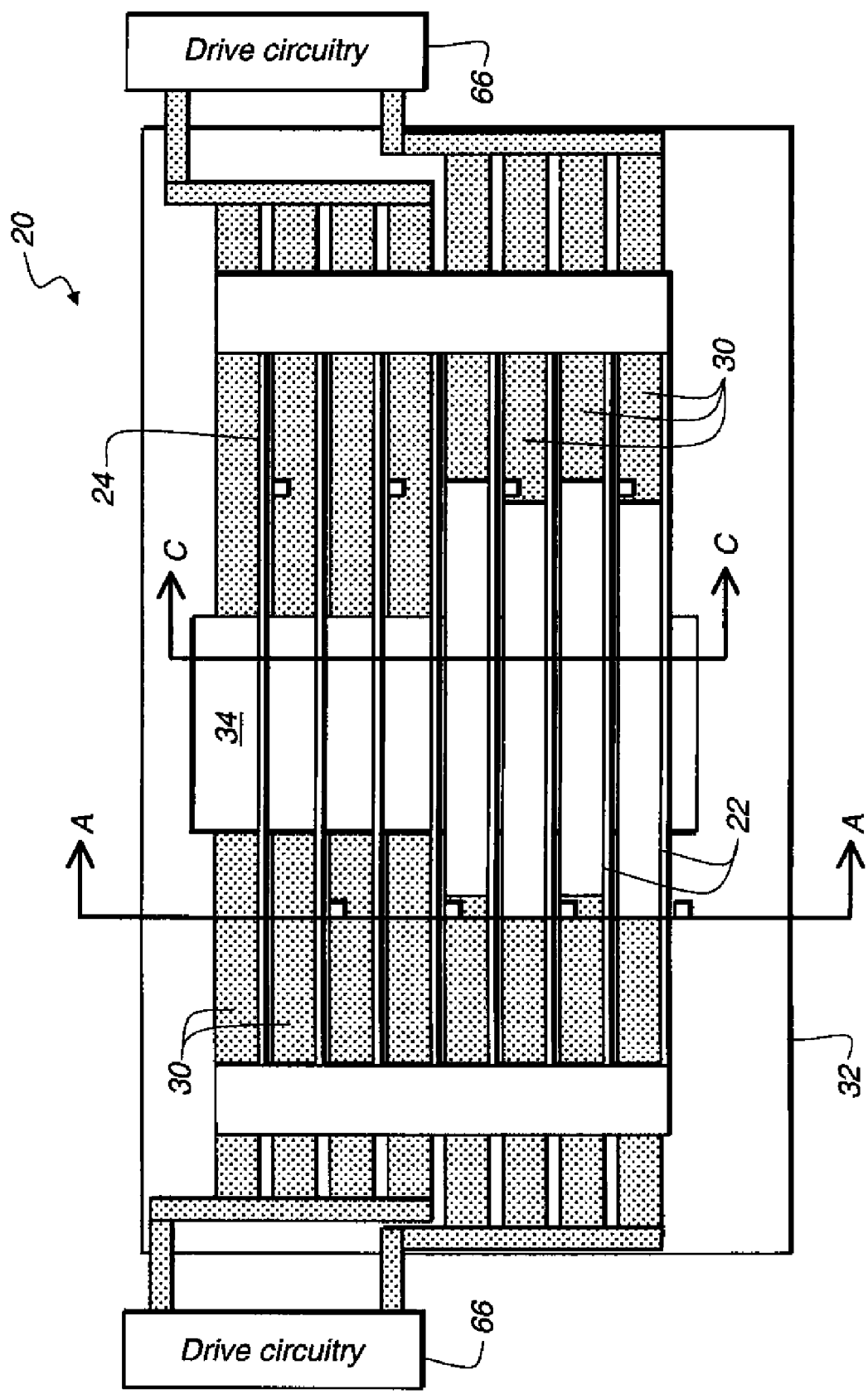

Advantageously, microshutter array 20 can be fabricated using any of a number of methods for MEMS device fabrication. FIGS. 7A, 7B, and 7C show, from a sensor-side plan view, the two primary patterned thin-film layers that form the basic functional subsystems that are fabricated in order to form this device. FIG. 7A shows the network of electrodes 30 that are formed in a plane that is parallel to the surface of frame 32. There are a number of techniques for forming a pattern of electrodes 30. One technique involves deposition of a metal or other conductive material onto a surface, then performing some type of etching operation to remove metal between the desired conductive traces. Suitable metals for electrodes include copper or aluminum, for example. Other conductive materials could be used, such as doped silicon or polysilicon.

Electrodes 30 can be individually addressable or may be grouped, so that an actuation signal can actuate a single shutter element 22 or can actuate multiple shutter elements 22 at a time. By way of illustration, groups of four electrodes 30 are connected together in the exaggerated-scale embodiment of FIG. 7A. It can be readily appreciated that any number of other interconnection schemes could be implemented, so that, for example, a single actuation signal would actuate only a single shutter element 22, a pair of shutter elements 22, or three, four, or more shutter elements 22. Interleaved patterns for actuating multiple shutter elements 22 at a time could also be implemented in the electrode-routing design.

FIG. 7B shows the arrangement of shutter elements 22 formed using MEMS fabrication techniques. For comparison, a block of four shutter elements 22 is shown in closed position; another block of shutter elements 23 is shown in the open position. As illustrated in the example embodiment of FIGS. 7B and 7C, all of the shutter elements 22 are electrically connected together. Addressing is done by electrodes 30. Shutter elements 22 can be at ground or at some other reference voltage potential.

In general, MEMS fabrication of this type of mechanical component involves deposition and etching of materials in a number of stages that form the component as initially fixed in place. Once the component is formed, the final stages in fabrication, often termed the release steps, free the component from sacrificial layers of material that were deposited earlier in the sequence. One partial sequence for forming and freeing shutter elements 22 is described in more detail subsequently.

FIG. 7C shows a sensor-side plan view in which the two electrode 30 and shutter element 22 arrays are combined to form microshutter array 20. Drive circuitry 66 can also be integrated into microshutter array 20 as illustrated in FIG. 7C.

Figure 8:
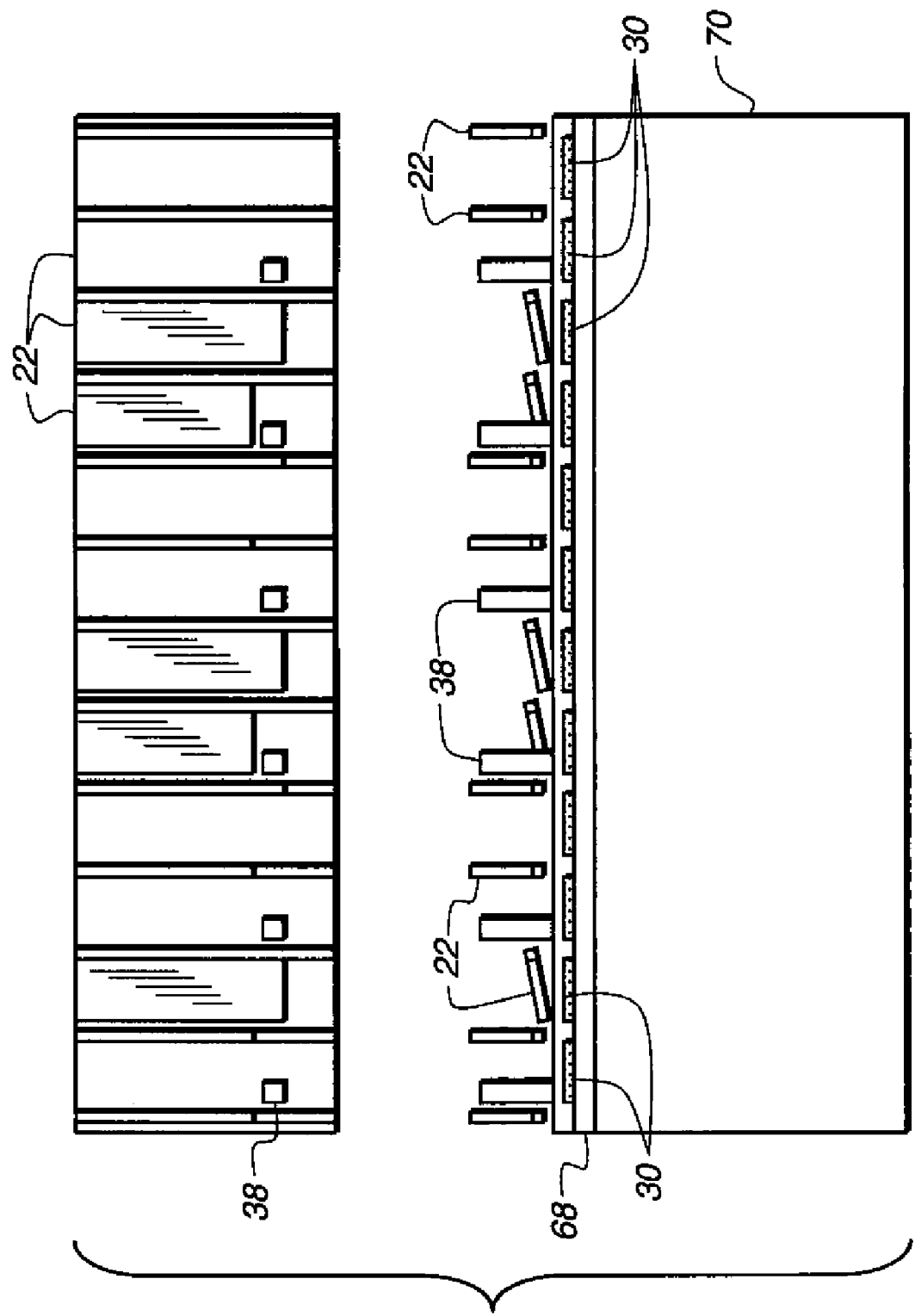
FIG. 8 shows the relative positions of electrodes 30 and shutter elements 22 in top view and cross section.
Figure 9:
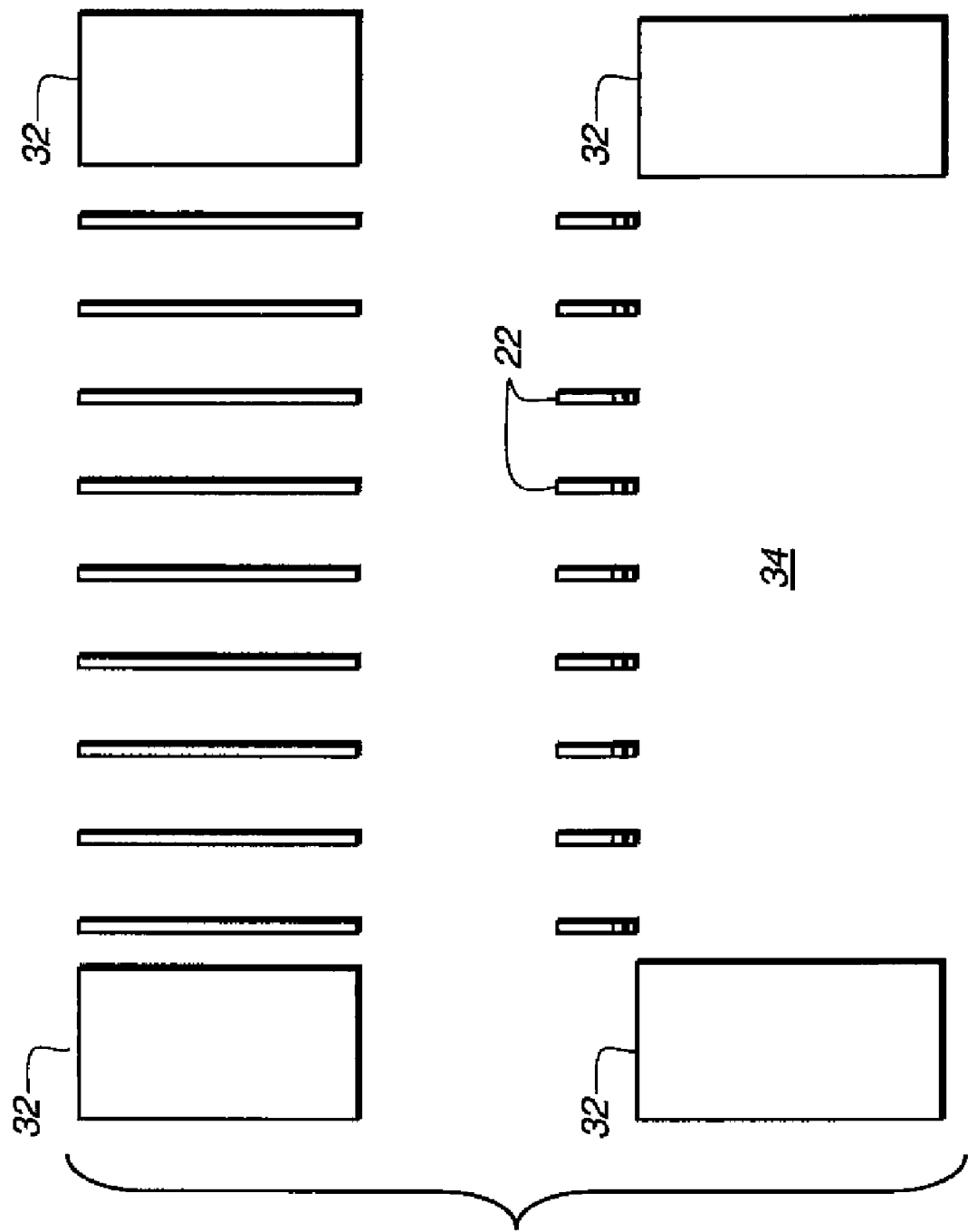
FIG. 9 shows the positions of shutter elements spanning the light-transmissive opening in the frame, in both cross section and partial top views.

FIG. 8 shows the relative positions of electrodes 30 and shutter elements 22 in top view and cross section. Electrodes 30 are formed on an insulating layer 68 that is deposited on a silicon base 70 for frame 32. Insulating layer 68 is silicon oxide (SiO2) in one embodiment. Shutter elements 22 are shown in both open and closed positions for reference. The top view and cross section views of FIG. 9, taken from view C-C of FIG. 7C, show shutter elements 22, all in the closed (actuated) position, spanning opening 34 in frame 32.

In one embodiment, basic steps for forming microshutter array 20 on a common substrate, such as a silicon substrate for example, are as follows:

(1) Form electrodes 30. As noted earlier, there are a number of conventional methods for fabricating a pattern of metal or doped polysilicon electrodes. In one embodiment, a silicon substrate is coated with an insulating thermal oxide layer, typically about 1 micron thick. A metal or polysilicon layer is then deposited, typically about 0.5 microns thick. For polysilicon, dopant is added over the electrode area, then an etching process is used to form the pattern of drive electrodes 30 from the doped material.

(2) Insulate electrodes 30 and form vias for posts 38. This next set of steps deposits and patterns insulation for the electrodes 30 formed in the preceding step. In addition, support structure for posts 38 or other mechanical features can also be configured.

(3) Form shutter elements 22. The process of forming shutter elements 22 can require several stages. In one embodiment, the structure for torsion arm 24 is set up first, followed by patterning of blade 26 portions. A polysilicon layer can be deposited and patterned as the base material for shutter element 22. Optionally, dopant can be added to enhance conductivity of blade 26. Shutter elements 22 can be formed from metals such as aluminum, nickel, copper, gold, or other metals. Amorphous silicon could also be used. A metal-coated shutter element 22 can also be formed. A series of temporary intermediate layers can be deposited, patterned, and etched in sequence to form the shutter element 22 structure. Posts 38 can also be formed during this step.

(4) Form electrical contacts. This step deposits and patterns wire bond pads for making connection to electrodes 30 on the device. As described earlier, a number of different arrangements are possible, so that a single signal actuates one or more than one shutter element 22 at a time.

(5) Form opening 34. Photolithographic etching is used to remove material, forming opening 34 in the substrate of frame 32. DRIE (Deep Reactive Ion Etching) methods are used in one embodiment. Alternately, an anisotropic KOH wet etch can be used if the substrate is silicon.

Figure 10:
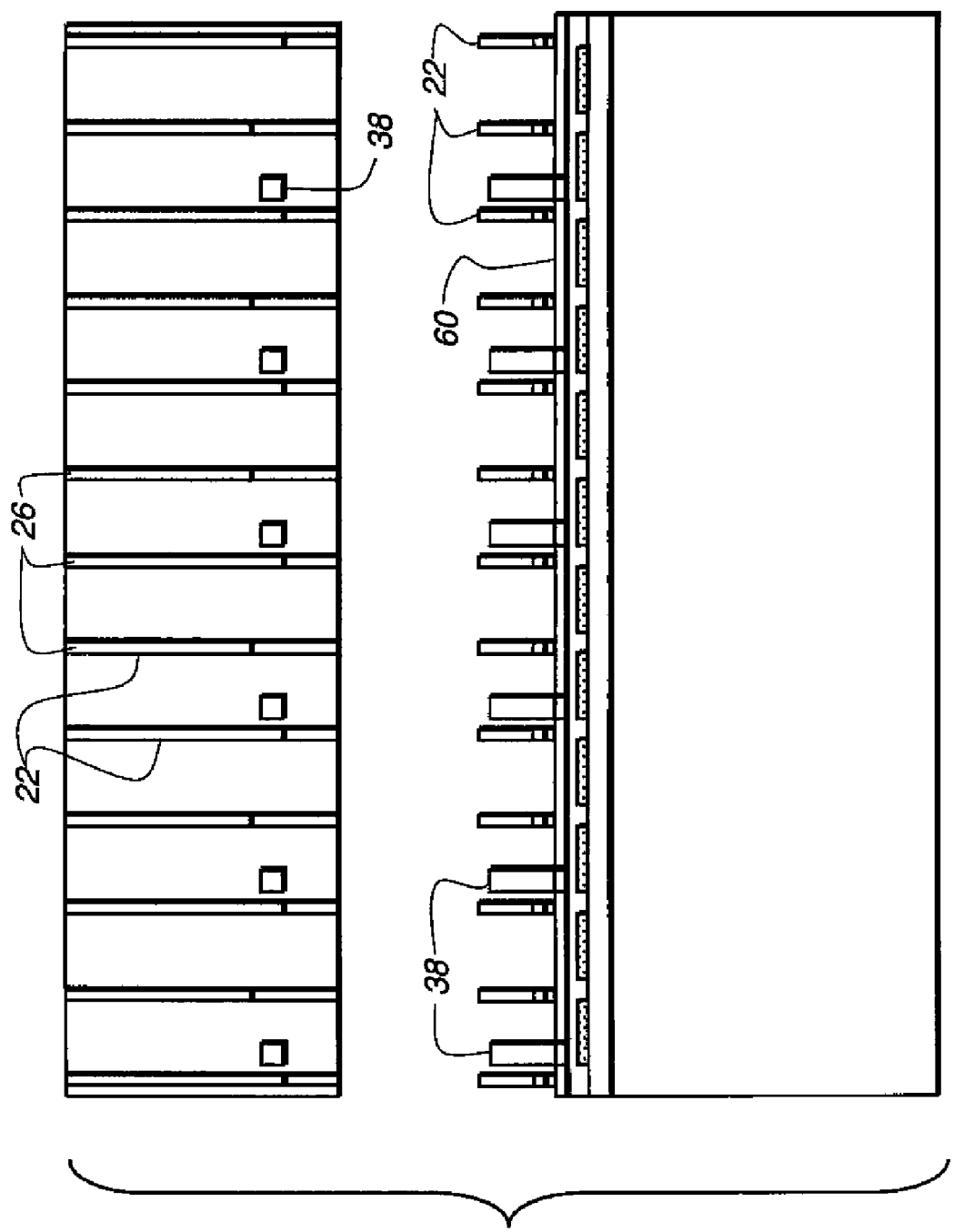
FIG. 10 shows a side view of a fabrication step just prior to etching and release of the shutter elements.

(6) Release shutter elements 22. Freeing shutter elements 22 to allow their independent open/shut actuation requires selective etching of material that was deposited to serve as a temporary surface for shutter element 22 construction. This material, now beneath shutter element 22, is etched away, releasing the assembled shutter elements 22, using techniques familiar to those skilled in MEMS fabrication. FIG. 10 shows top and side views of an example embodiment in which a polysilicon layer 60 acts as a temporary structure in this way. Removal of polysilicon layer 60 using etching techniques then frees shutter elements 22, providing the configuration previously described with reference to FIG. 8.

The steps just described outline the basic stages of microshutter array 20 fabrication in one embodiment and can be implemented by those skilled in the MEMS fabrication arts, using any of a number of appropriate tools and materials. Materials deposition, for example, can be done in a number of ways, such as using a low-pressure Chemical Vapor Deposition (CVD) process, sputtering, evaporative deposition, or other process that provides sufficient control of deposition depth and is suitable for the materials and substrate used. Etching processes can use wet or dry etch techniques, as appropriate. Deep Reactive Ion Etching (DRIE) may have particular value, particularly where a considerable amount of material must be removed, such as in forming opening 34, for example.

Dimensions given herein are provided to give an idea of relative scale and are not intended to be limiting. In one embodiment, shutter elements are 1.5 mm in length (L in FIG. 2A) with blades 26 having a breadth dimension of about 3.5 microns. Torsion arm cross-sectional thickness is on the order of 1 micron. For an image sensor with a 1.5×1.5 mm active area and a pixel pitch of about 4 microns, the device has approximately 380 shutter elements 22. It can be appreciated that, to the unaided eye, microshutter array 20 formed using MEMS techniques would have the appearance of a continuous surface. With all shutter elements 22 in the closed position, microshutter array 20 would appear to be very nearly transparent over the area of opening 34. Because it would be extremely unwieldy to represent the architecture and function of shutter elements 22 to scale, figures in this disclosure considerably exaggerate the relative proportions of these devices and show only a small number of them in an array.

Figure 11:
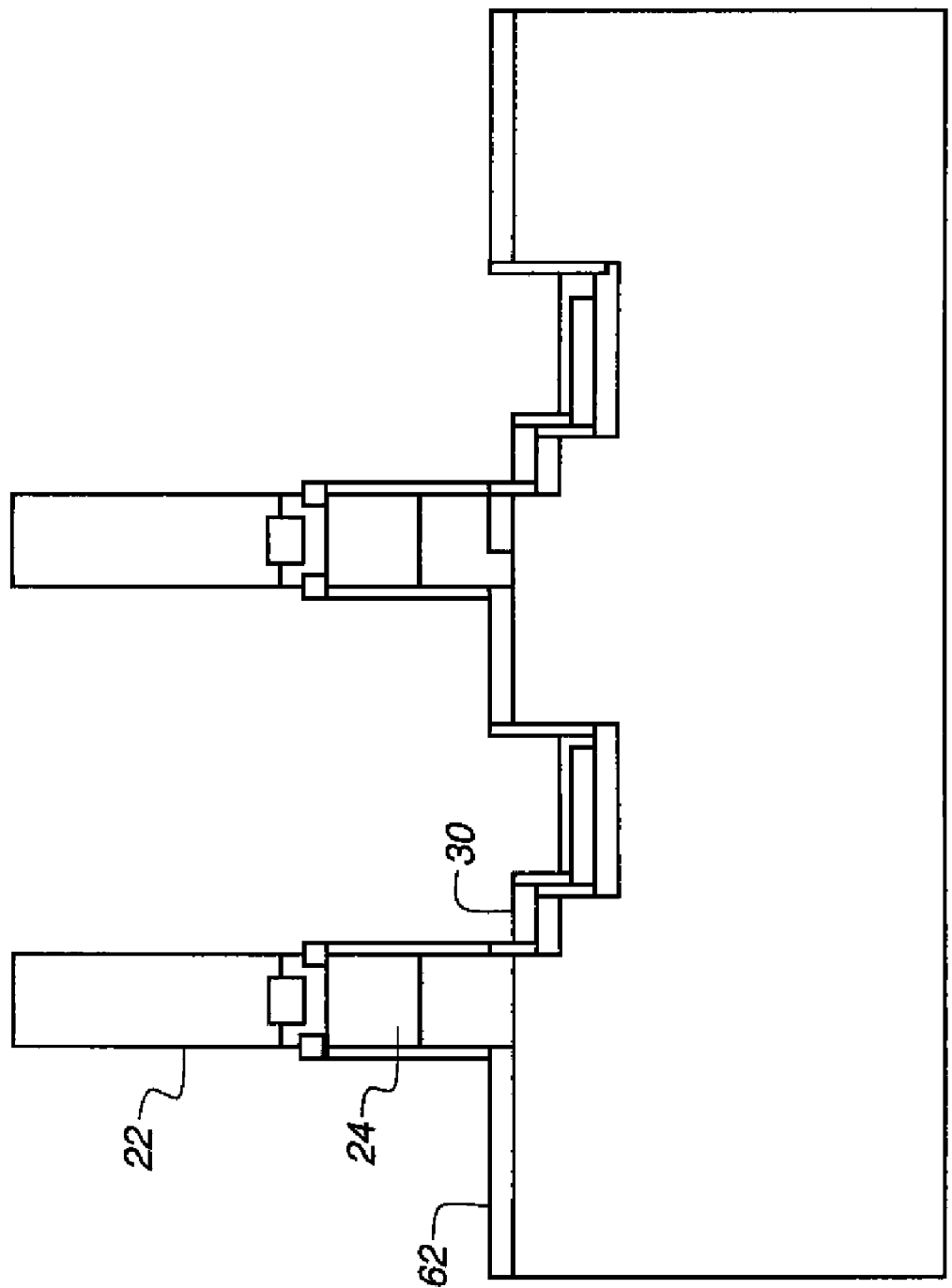
FIG. 11 shows a cross-sectional view of fabrication for an embodiment using a stepped-electrode arrangement, just prior to etching and release of the shutter elements.
Figure 12:
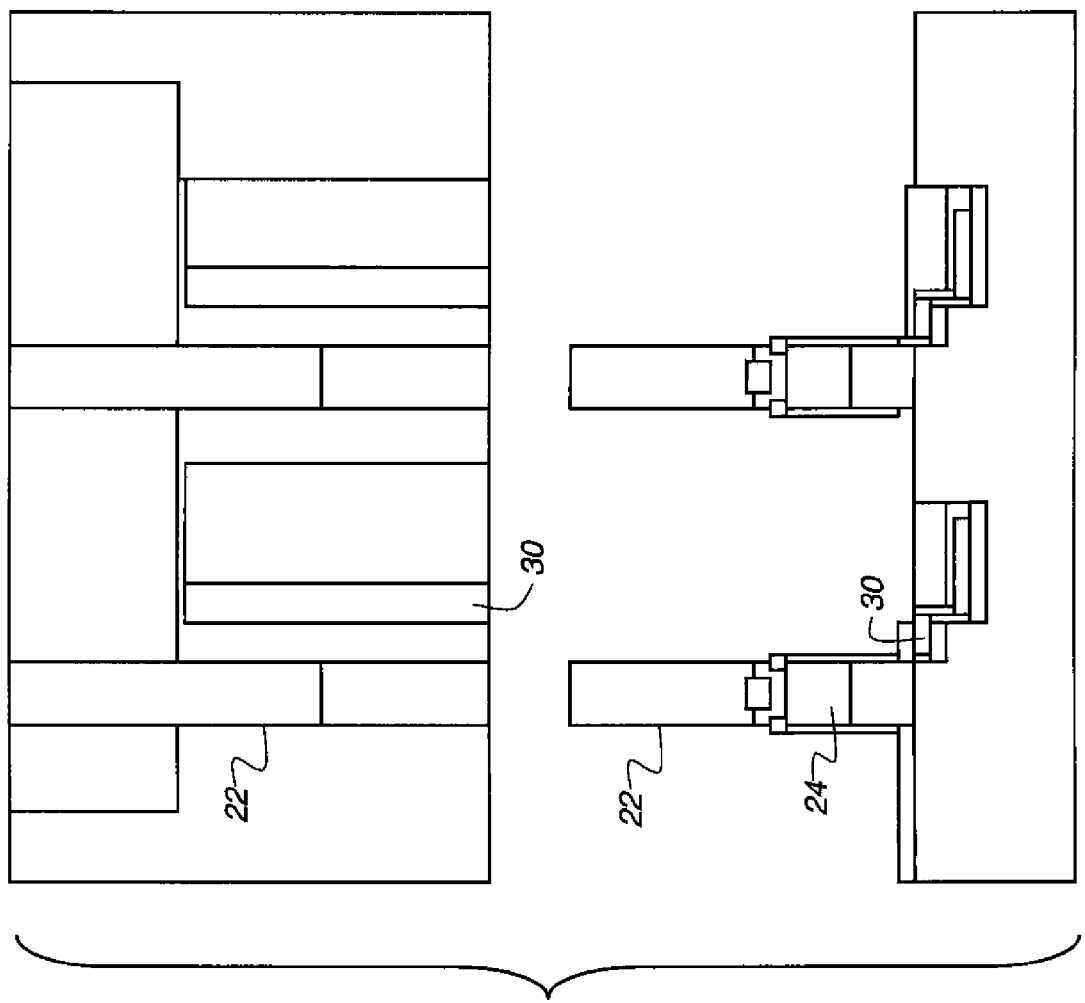
FIG. 12 shows the released shutter elements in their normally-open, unactuated position.
Figure 13:
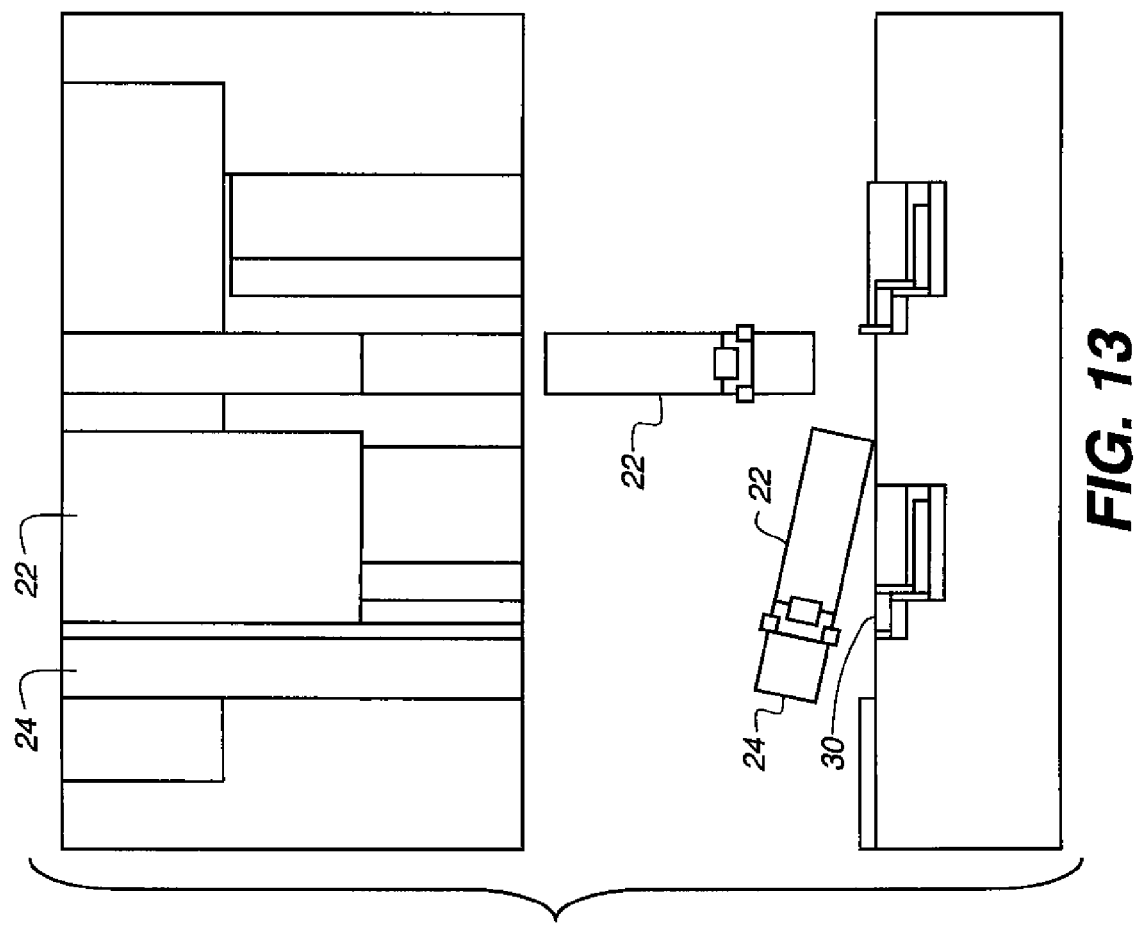
FIG. 13 shows the actuation of one of the shutter elements.

It can also be appreciated that there can be a number of modifications to the configurations shown for helping to improve device fabrication and performance. FIGS. 11 through 13 show an alternate embodiment that uses a stepped electrode 30, wherein a portion of electrode 30 is disposed nearer to shutter element 22 in order to provide improved electrostatic attraction, biasing its corresponding shutter element 22 in the intended direction. Adjacent portions of stepped electrode 30 are, in turn, further from the adjacent shutter element 22, which helps to minimize false actuation. FIG. 11 shows two shutter elements 22 in final stages of fabrication, prior to release. Here, a photoresist layer 62 holds shutter element 22 temporarily in place during shutter and stepped electrode fabrication. Removal of photoresist layer 62, such as by hydrofluoric (HF) vapor oxide removal, then frees shutter element 22 as shown in the side and top views of FIG. 12. FIG. 13 shows one of shutter elements 22 in its actuated (closed) state.

Operation and Timing

Within microshutter array 20, individual shutter elements 22 are individually addressable and actuable. This allows a number of operation sequence options, including emulation of a rolling shutter, such as that conventionally used for CMOS image sensors in digital camera operations. Conventionally performed by adjusting exposure and reset timing for a moving swath consisting of multiple rows of pixels, rolling shutter operation allows exposure and readout of the image sensor to occur progressively row-by-row across the rows of the image sensor. This rolling shutter sequence avoids the differential exposure problem that the interlaced fields of a CCD exhibit by making the exposure for each row the same length of time.

FIG. 14 shows a portion of a timing sequence for effecting rolling shutter operation for a set of adjacent shutter elements 22 in microshutter array 20 in one embodiment. In this example, timing for nine shutter elements 22, labeled shutter n through shutter n+8 is shown. For this sequence, a positive voltage signal latches shutter element 22 shut; zero voltage (signal ground) opens shutter element 22. At time t0, shutter n is open, exposing one or more corresponding rows of the image sensor until it closes at time t2 at the end of this time period. Pixels associated with shutter n can then be read and reset. At time t1, shutter n+1 opens and allows exposure until it closes at time t3. This pattern repeats, effectively sequencing through the shutters so that their corresponding rows of pixels are exposed over different time periods, which may or may not be overlapping. It can be appreciated that this arrangement can be modified in a number of ways, including the grouping of multiple shutter elements 22 for actuation during the same time period by the same voltage signal, for example.

Microshutter array 20 can also be used to shutter all the pixels on sensor 12 simultaneously in order to reduce rolling shutter artifacts like image shear that are commonly found in image capture systems with CMOS image sensors. Interlaced operation can also be provided, grouping one or more non-adjacent shutter elements 22 so that they are actuated simultaneously during one time period, while other grouped shutter elements remain un-actuated until a later time period. Further, the microshutter array 20 can be used to provide different exposure time periods to different rows of pixels thereby enabling adjustments within the image in response to aspects of the scene being imaged such as darker and lighter portions within the scene. In summary, individual control of shutter elements 22 allows any of a number of different actuation and timing arrangements, suitable for row-by-row pixel exposure or other applications in which a window (that is, frame 32) allows variable transmission of light, controllable in narrow lengthwise portions using individually actuable shutters.

Unlike conventional MEMS microshutter solutions, microshutter array 20 of the present embodiment uses shutter elements 22 having an extended length, scalable to extend fully across a small sensor 12 (FIG. 1) to shutter one or more rows of pixels from light passing through a light transmissive portion 34 of the frame 32. Accordingly, the width of the shutter elements 22 is such that it will cover one row of pixels or multiple rows of pixels. Shutter elements 22 are normally open and are electrostatically actuable for closing. Voltage levels needed for actuation are on the order of 30 Vdc or less. Electrodes extend in a plane parallel to the face of the microshutter array 20 package and with the major portion of each electrode lying parallel to a plane that is substantially normal to the direction of incident light. This substantially planar arrangement simplifies the fabrication task for depositing and patterning electrodes. When formed on a clear substrate, as was shown in the example embodiment of FIG. 4B, the actuating electrode can lie in the path of incident light.

Microshutter array 20 can be integrated with sensor 12 as part of a compact imaging module. Because it can be positioned adjacent to sensor 12 or at any suitable point in the image space of image-forming lens L1 (FIG. 1), microshutter array 20 enables very compact imaging module design in comparison with conventional shutter mechanisms that are generally positioned only near the iris, in order to avoid shadowing artifacts in the image. An imaging module thus formed can be relatively light-tight and dust-free. Any shadowing artifacts are exhibited as fixed-pattern noise, which can be corrected digitally in a straightforward manner. Further, imaging problems that affect sensor performance for hand-held imaging devices, such as image shear, can be effectively compensated or eliminated using a mechanical shutter array. Microshutter array 20 is capable of very fast shutter times.

In a further embodiment of the invention, the microshutter 20 is used in a digital camera system to capture images with multiple opening and closing of the aperture to produce a multiple exposure image. Multiple exposure images can be used as a technique to enable enhanced deblurring.

A digital camera can include a ferro-electric shutter wherein the ferro-electric shutter is a conventional shutter that closes the entire aperture of the lens and is positioned at the iris in the lens assembly or at the object end of the lens assembly. By rapidly opening and closing the ferro-electric shutter during a single image capture, an image is captured which is the result of multiple exposures overlaid on top of one another. Algorithms have been developed which remove the majority of the blur produced by motion within the scene that was imaged by analyzing the patterns created in the multiple exposure image by the multiple exposures. A problem is that the digital camera system with the ferro-electric shutter is bulky, and as such, not suited to implementation in a small consumer digital camera.

In contrast, as was earlier stated, microshutter array 20 can be integrated with sensor 12 as part of a compact imaging module that can be included in small consumer digital cameras. In addition, the response time of the microshutter array 20 of 10-20 microseconds is much faster than the ferro-electric shutter which has a switching time of 100 microseconds so that shorter exposure times can be provided by the microshutter array 20 with more sharply defined shutter transitions from open to closed. Consequently, the use of a microshutter 20 in a digital camera system represents an improved digital camera system that is more compact for producing a multiple exposure image.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, a variety of fabrication alternatives are available.

PARTS LIST 10 imaging apparatus
12 sensor
14 lens array
16 control logic processor
18 image processing component
20 microshutter array
22 shutter element
22f microshutter element
23 shutter element
24 torsion arm
26 blade
28 journal bearing
30 electrode
32 frame
34 opening
38 post
40 pixel element
41 lenslet
42 anchor
44 lenslet
60 polysilicon layer
62 photoresist layer
64 subject
66 drive circuitry
68 insulating layer
70 base
I incident light
L length
L1 image-forming lens
SW1 switch
t0, t1, t2, t3 time

What is claimed is:

1. A microshutter array comprising a frame having a single opening that includes a light transmissive portion;
a plurality of linear microshutter elements extending across the light transmissive portion and in parallel to each other, each microshutter element comprises a flat blade extended in a length direction across a width of the light transmissive portion and first and second torsion arms extending outwards from each side of the blade in the length direction and connected to the frame; and
at least one electrode associated with each linear microshutter element and extended in the length direction parallel to the microshutter element.

2. The microshutter array of claim 1, wherein the light transmissive portion is a transparent material.

3. The microshutter array of claim 2, wherein the at least one electrode associated with each linear microshutter element is formed with the transparent material.

4. The microshutter array of claim 3, wherein the at least one electrode associated with each linear microshutter element extends at least partially across the width of the light transmissive portion.

5. The microshutter array of claim 1, wherein the light transmissive portion is hollow.

6. The microshutter array of claim 1, wherein the frame is silicon or quartz.

7. The microshutter array of claim 1, wherein the flat blade allows light transmission through the light transmissive portion in an unactuated position and blocks light transmission when actuated.

8. The microshutter array of claim 1 further comprising a voltage source switchably connected to the at least one electrode.

9. The microshutter array of claim 1, wherein the at least one electrode is transparent.

10. The microshutter array of claim 1, wherein each liner microshutter element is individually actuable.

11. The microshutter array of claim 1, wherein at least a portion of the at least one electrode lies in a plane that is orthogonal relative to the path of light transmitted through the array.

12. The microshutter array of claim 1, wherein the microshutter element is formed from a material taken from the group consisting of silicon, gold, copper, aluminum, and nickel.

13. The microshutter array of claim 1, wherein the at least one electrode has a raised portion nearest its associated liner microshutter element.

14. The microshutter array of claim 1, wherein the at least one electrode is formed on the surface of the frame that faces the plurality of linear microshutter elements.

15. The microshutter array of claim 1, wherein each microshutter element is at the same electrical potential.

16. The microshutter array of claim 1 being formed onto a single substrate.

17. The microshutter array of claim 1, wherein lenslets are used to direct light between the microshutter elements.

18. The microshutter array of claim 1, wherein the plurality of linear microshutter elements form a one-dimensional array.

19. A method for forming an image of a scene comprising:
providing an image-forming lens for directing light to a sensor having an array of pixel elements arranged in rows;
disposing a microshutter array between the image-forming lens and the sensor wherein the microshutter array includes a plurality of linear microshutter elements each comprising a flat blade extended in a length direction across a width of a light transmissive portion and spanning one or more rows of pixel elements; and
actuating one or more microshutter elements in the microshutter array for exposing associated rows of pixel elements to the light.

20. The method of claim 19 further comprising:
resetting the pixel elements in at least one row to begin an exposure;
actuating a first group having one or more microshutter elements during a first time period; and
actuating a second group having one or more microshutter elements during a second time period.

21. The method of claim 20, wherein actuating the first and second group further comprises providing similar exposure time periods for the different rows.

22. The method of claim 20, wherein actuating the first and second group further comprises providing different exposure time periods for the different rows.

23. The method of claim 20, wherein actuating the first and second group further comprises selecting exposure times for the different rows based on aspects of the scene being imaged.

24. The method of claim 20 further comprising interlacing the first group and the second group of microshutter elements.

25. The method of claim 20, wherein actuating the first group comprises actuating a single microshutter element.

26. The method of claim 20, wherein actuating the second group comprises actuating a single microshutter element.

27. An imaging module, comprising:
- an imaging sensor comprising an array of pixels arranged in rows; and
- a microshutter array positioned over the array of pixels, wherein the microshutter array comprises:
  - a frame having a single opening that includes a light transmissive portion extending across the array of pixels;
  - a plurality of linear microshutter elements extending across the light transmissive portion and in parallel to each other, each microshutter element comprises a flat blade extended in a length direction across a width of the light transmissive portion and spanning one or more rows of pixels in the array and first and second torsion arms extending outwards from each side of the blade in the length direction and connected to the frame; and
  - at least one electrode associated with each linear microshutter element.

28. The imaging module of claim 27, wherein the at least one electrode associated with each linear microshutter element is extended in the length direction parallel to the microshutter element.

* * * * *

UNITED STATES PATENT AND TRADEMARK OFFICE
CERTIFICATE OF CORRECTION

| | | |
|---|---|---|
| PATENT NO. | : 7,684,101 B2 | Page 1 of 1 |
| APPLICATION NO. | : 11/870465 | |
| DATED | : March 23, 2010 | |
| INVENTOR(S) | : Border et al. | |

It is certified that error appears in the above-identified patent and that said Letters Patent is hereby corrected as shown below:

In Column 12, Line 12, (claim 10, line 1) delete "liner" and replace with -- linear --

In Column 12, Line 23, (claim 13, line 2) delete "liner" and replace with -- linear --

In Column 12, Line 42, (claim 19, line 6) after "sensor" insert -- , --

Signed and Sealed this
Fifteenth Day of November, 2011

David J. Kappos
*Director of the United States Patent and Trademark Office*